(12) United States Patent
Lee et al.

(10) Patent No.: US 11,557,677 B2
(45) Date of Patent: Jan. 17, 2023

(54) INTEGRATED CIRCUIT DEVICE AND METHOD OF MANUFACTURING THE SAME

(71) Applicant: Samsung Electronics Co., Ltd., Suwon-si (KR)

(72) Inventors: Ji-seung Lee, Seoul (KR); Yun-seung Kang, Seoul (KR); Soung-hee Lee, Hwaseong-si (KR); Sang-gyo Chung, Anyang-si (KR); Hyun-chul Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 152 days.

(21) Appl. No.: 17/101,178

(22) Filed: Nov. 23, 2020

(65) Prior Publication Data
US 2021/0074860 A1    Mar. 11, 2021

Related U.S. Application Data

(62) Division of application No. 16/111,643, filed on Aug. 24, 2018, now Pat. No. 10,879,398.

(30) Foreign Application Priority Data

Jan. 18, 2018  (KR) .................. 10-2018-0006627

(51) Int. Cl.
*H01L 29/78*     (2006.01)
*H01L 27/088*    (2006.01)
(Continued)

(52) U.S. Cl.
CPC .... *H01L 29/7851* (2013.01); *H01L 21/76224* (2013.01); *H01L 21/823431* (2013.01);
(Continued)

(58) Field of Classification Search
CPC ............. H01L 29/7851; H01L 29/7854; H01L 21/823431; H01L 29/66818; H01L 21/76224
See application file for complete search history.

(56) References Cited

U.S. PATENT DOCUMENTS 7,407,847 B2 *   8/2008   Doyle ............... H01L 29/66818
                                                        438/164
7,939,403 B2 *   5/2011   Grisham ........... H01L 27/10823
                                                        438/239
(Continued)

FOREIGN PATENT DOCUMENTS

JP    2011-129761 A    6/2011
JP      5707098 B2     4/2015
(Continued)

OTHER PUBLICATIONS

Non-Final Office Action dated Jan. 3, 2020 in U.S. Appl. No. 16/111,643.
(Continued)

*Primary Examiner* — Bilkis Jahan
*Assistant Examiner* — Victor V Barzykin
(74) *Attorney, Agent, or Firm* — Harness, Dickey & Pierce, P.L.C.

(57) ABSTRACT

An integrated circuit device includes a device isolation trench defining an active area, a gate trench extending in a first direction across the active area and the device isolation film, a gate dielectric film covering an inner wall of the gate trench, and a conductive line filling a part of the gate trench above the gate dielectric film. The active area includes a fin body portion located under the conductive line, and a thinner fin portion protruding from the fin body portion toward the conductive line and having a width less than a width of the fin body portion in the first direction.

19 Claims, 18 Drawing Sheets

(51) Int. Cl.
- *H01L 29/10* (2006.01)
- *H01L 29/423* (2006.01)
- *H01L 29/66* (2006.01)
- *H01L 21/762* (2006.01)
- *H01L 21/8234* (2006.01)

(52) U.S. Cl.
CPC ...... *H01L 27/0886* (2013.01); *H01L 29/1037* (2013.01); *H01L 29/4236* (2013.01); *H01L 29/66818* (2013.01); *H01L 29/7854* (2013.01)

(56) References Cited

U.S. PATENT DOCUMENTS

| | | | | |
|---|---|---|---|---|
| 8,772,860 | B2* | 7/2014 | Huang | H01L 29/7854 257/E21.442 |
| 9,646,871 | B2* | 5/2017 | Chang | H01L 29/0649 |
| 10,056,491 | B2* | 8/2018 | Jeong | H01L 21/28158 |
| 10,879,398 | B2* | 12/2020 | Lee | H01L 21/823431 |
| 2007/0059897 | A1* | 3/2007 | Tilke | H01L 21/3065 257/E21.235 |
| 2011/0151641 | A1* | 6/2011 | Ota | H01L 29/4236 438/435 |
| 2012/0091532 | A1* | 4/2012 | Han | H01L 21/823456 257/E27.06 |
| 2014/0008734 | A1* | 1/2014 | Lu | H01L 21/823431 257/E21.409 |
| 2016/0218180 | A1* | 7/2016 | You | H01L 29/66545 |
| 2016/0293598 | A1* | 10/2016 | Kim | H01L 29/0684 |
| 2017/0229310 | A1* | 8/2017 | Fung | H01L 29/66795 |
| 2017/0358680 | A1* | 12/2017 | Jeong | H01L 29/7854 |
| 2019/0165145 | A1* | 5/2019 | Ghani | H01L 21/02532 |

FOREIGN PATENT DOCUMENTS

| | | |
|---|---|---|
| KR | 10-2016-0092248 A | 8/2016 |
| KR | 10-2016-0118561 A | 10/2016 |
| KR | 10-2017-0140840 A | 12/2017 |

OTHER PUBLICATIONS

Final Office Action dated Jun. 9, 2020 in U.S. Appl. No. 16/111,643.
Notice of Allowance dated Aug. 24, 2020 in U.S. Appl. No. 16/111,643.
Reason for Refusal dated Oct. 31, 2021 in Korean Application No. 10-2018-0006627.
Notice of Allowance dated May 31, 2022 in Korean Patent Application No. 10-2018-0006627.

* cited by examiner

A − A'

INTEGRATED CIRCUIT DEVICE AND METHOD OF MANUFACTURING THE SAME

CROSS-REFERENCE TO RELATED APPLICATIONS

This application is a Divisional Application of U.S. application Ser. No. 16/111,643, filed on Aug. 24, 2018, which claims the benefit of Korean Patent Application No. 10-2018-0006627, filed on Jan. 18, 2018, in the Korean Intellectual Property Office, the disclosure of which is incorporated herein in its entirety by reference.

BACKGROUND

The inventive concepts relate to an integrated circuit device, and particularly, to an integrated circuit device having a buried word line and a method of manufacturing the same.

As a degree of integration of an integrated circuit device that forms a buried channel array transistor (BCAT) having a plurality of word lines buried in a substrate increases, the pitch of a plurality of active areas and/or the pitch of a plurality of word lines gradually decreases, which may have an adverse effect on the refresh characteristics of the integrated circuit device. Accordingly, in order to improve the characteristics of a cell drive current by more accurately controlling a threshold voltage of a gate electrode and/or improving the off characteristics of a cell transistor, a variety of technologies to extend the channel width of a transistor have been suggested. However, there is a limitation in securing a deposition process margin to fill a space between neighboring active areas with desired materials without a deposition defect such as a seam or a void, due to a decreased interval between the active areas.

SUMMARY

The inventive concepts effectively extend the channel width while overcoming deposition defect problems due to a decreased interval between active areas.

The inventive concepts provide an integrated circuit device having a structure which may extend the channel width of a cell transistor and/or improve the characteristics of a cell drive current, even when the size of a cell transistor area decreases and/or the pitch of a plurality of active areas decreases according to downscaling of an integrated circuit device including a buried channel array transistor (BCAT).

The inventive concepts provide a method of manufacturing an integrated circuit device which may extend the channel width of a cell transistor while overcoming a deposition defect problem due to a decreased interval between active areas, even when the size of a cell transistor area decreases and/or the pitch of a plurality of active areas decreases according to downscaling of an integrated circuit device including a BCAT.

According to an aspect of the inventive concepts, there is provided an integrated circuit device including a substrate in which a device isolation trench that defines an active area is formed, a device isolation film filling the device isolation trench around the active area, a gate trench extending in a first direction across the active area and the device isolation film, a gate dielectric film covering an inner wall of the gate trench, and a conductive line filling a part of the gate trench above the gate dielectric film, in which the active area comprises a fin body portion located under the conductive line, and a thinner fin portion protruding from the fin body portion toward the conductive line and having a width less than a width of the fin body portion in the first direction.

According to another aspect of the inventive concepts, there is provided an integrated circuit device including a substrate having a plurality of active areas that are arranged in a row in a first direction, a device isolation film surrounding the plurality of active areas on the substrate, and a conductive line extending across the plurality of active areas in the substrate, in which each of the plurality of active areas comprises a fin body portion located under the conductive line and a thinner fin portion protruding from the fin body portion toward the conductive line and having a width less than a width of the fin body portion in the first direction.

According to another aspect of the inventive concepts, there is provided an integrated circuit device including a substrate having a cell array area, a peripheral circuit area, and an interface area between the cell array area and the peripheral circuit area, a plurality of active areas defined in the substrate in the cell array area, a device isolation film covering a side wall of each of the plurality of active areas in the cell array area, an interface device isolation film filling an interface trench formed in the substrate in the interface area, and a plurality of conductive lines extending in the cell array area across the plurality of active areas in a first direction, in which each of the plurality of active areas comprises a fin body portion located under the conductive line and a thinner fin portion protruding from the fin body portion toward the conductive line and having a width less than a width of the fin body portion in the first direction.

According to another aspect of the inventive concepts, there is provided a method of manufacturing an integrated circuit device, which includes forming, by etching a substrate, a device isolation trench including an extended trench area at a level lower than a first depth from a top surface of the substrate, and defining, in the substrate, a plurality of active areas, each of the plurality of active areas including a fin body portion having a first width at a level lower than a level of the extended trench area and a middle active area defined by the extended trench area and having a second width less than the first width, forming a device isolation film in the device isolation trench, forming a gate trench extending in a first direction across the plurality of active areas and the device isolation film by removing parts of the plurality of active areas and a part of the device isolation film, and simultaneously forming, in each of the plurality of active areas, a thinner fin portion protruding from the fin body portion and having a width less than a width of the fin body portion in the first direction, forming, in the gate trench, a gate dielectric film covering the device isolation film and the thinner fin portion, and forming a conductive line above the gate dielectric film in the gate trench.

BRIEF DESCRIPTION OF THE DRAWINGS

Embodiments of the inventive concepts will be more clearly understood from the following detailed description taken in conjunction with the accompanying drawings in which:

FIGS. 5A to 5C illustrate main configurations of an integrated circuit device according to an embodiment, in which FIG. 5A is a cross-sectional view of some configurations, taken along line A-A' of FIG. 4, FIG. 5B is a cross-sectional view of some configurations, taken along line B-B' of FIG. 4, and FIG. 5C is a cross-sectional view of some configurations, taken along line C-C' of FIG. 4;

DETAILED DESCRIPTION OF EXAMPLE EMBODIMENTS

Figure 1:
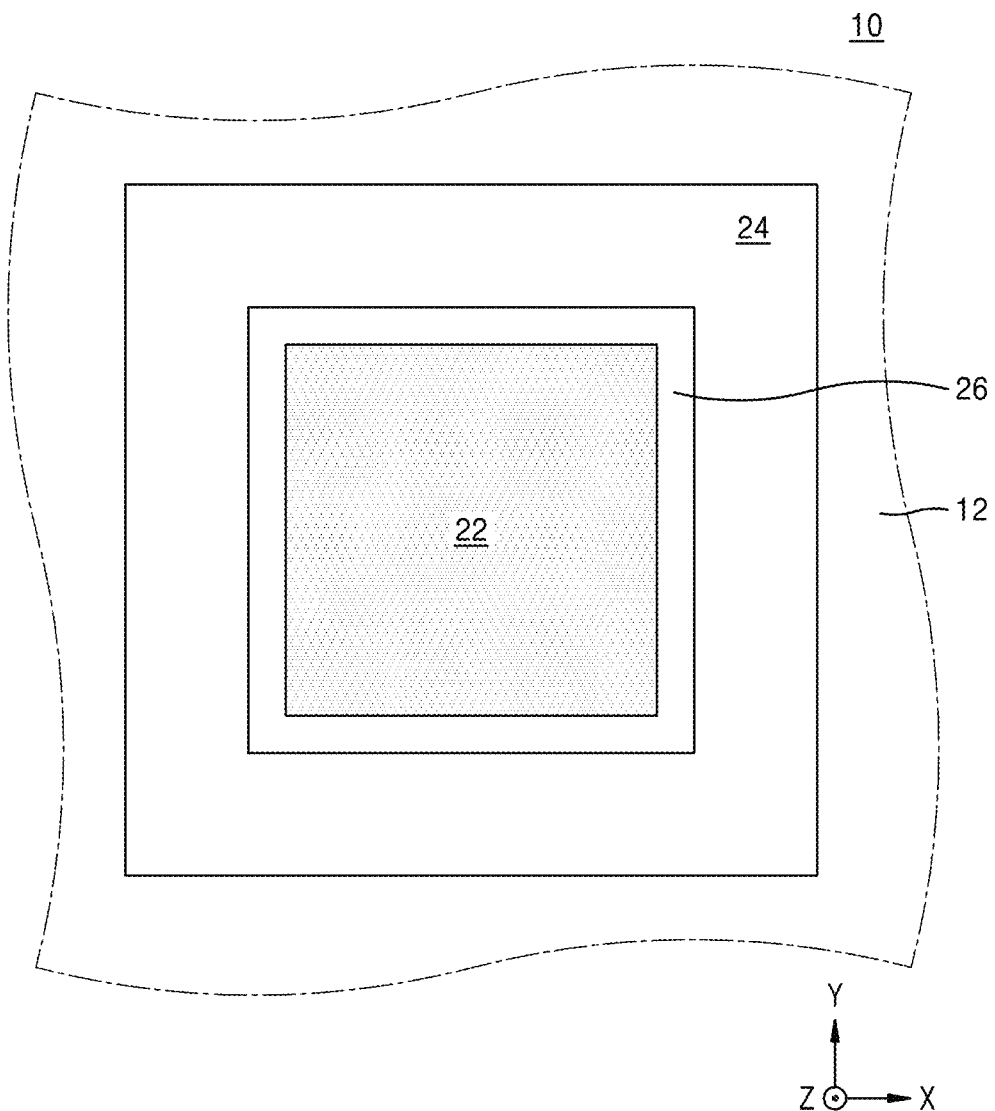
FIG. 1 is a schematic plan view of a configuration of an integrated circuit device according to an embodiment.

FIG. 1 is a schematic plan view of a configuration of an integrated circuit device 10 according to an embodiment.

The integrated circuit device 10 may have a substrate 12 including a first area 22, a second area 24 surrounding the first area 22, and/or an interface area 26 provided between the first area 22 and the second area 24.

The substrate 12 may include, for example, a semiconductor element such as Si or Ge, or at least one compound semiconductor selected from SiGe, SiC, GaAs, InAs, and InP. The substrate 12 may include a conductive area, for example, a well doped with impurities or a structure doped with impurities.

In some embodiments, the first area 22 may be a memory cell area of the integrated circuit device 10. In some embodiments, the first area 22 may be a memory cell area of dynamic random access memory (DRAM). The first area 22 may include a unit memory cell having a transistor and a capacitor, or a unit memory cell having a switching device and a variable resistor.

The second area 24 may be a core area or a peripheral circuit area (hereinafter, referred to as the "peripheral circuit area"). Peripheral circuits for driving memory cells in the first area 22 may be arranged in the second area 24.

A plurality of conductive lines for electrical connection between the first area 22 and the second area 24, and a plurality of insulating structures for insulation between the first area 22 and the second area 24, may be arranged in the interface area 26.

Figure 2:
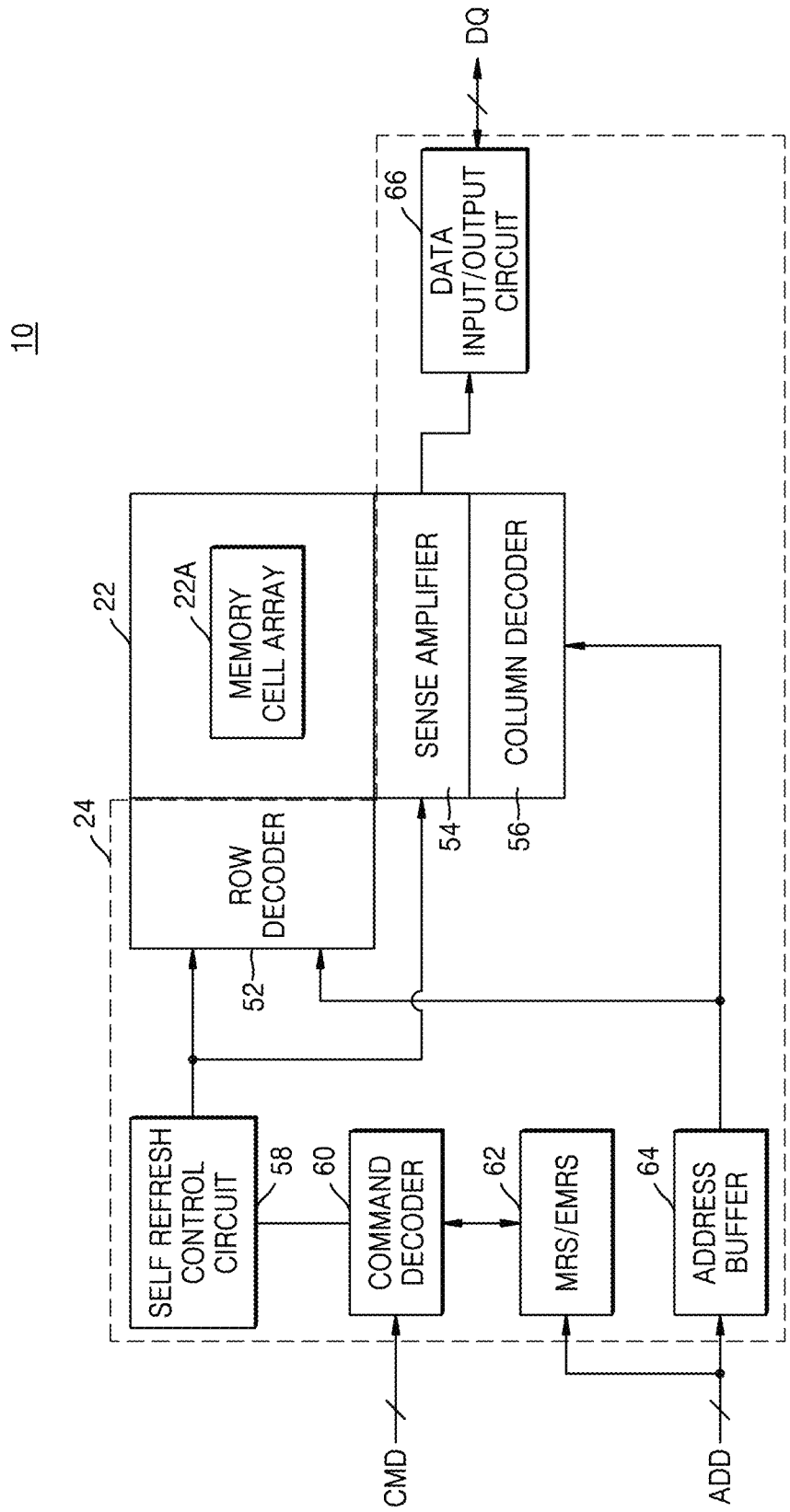
FIG. 2 is a block diagram of an example configuration of an integrated circuit device formed as a DRAM device.

FIG. 2 is a block diagram of an example configuration of an integrated circuit device formed as a DRAM device.

Referring to FIG. 2, in the integrated circuit device 10, the first area 22 may be a memory cell area of a DRAM device, and the second area 24 may be a peripheral circuit area of the DRAM device. The first area 22 may include a memory cell array 22A. In the memory cell array 22A, a plurality of memory cells for storing data may be arranged in a row direction and a column direction. Each of the memory cells may include a cell capacitor and an access transistor. A gate of an access transistor may be connected to a corresponding word line of a plurality of word lines arranged in the row direction. One of a source and a drain of the access transistor may be connected to a bit line or a complementary bit line arranged in the column direction, and the other one of the source and the drain may be connected to a cell capacitor.

The second area 24 may include a row decoder 52, a sense amplifier 54, a column decoder 56, a self-refresh control circuit 58, a command decoder 60, a mode register set/extended mode register set (MRS/EMRS) circuit 62, an address buffer 64, and/or a data input/output circuit 66.

The sense amplifier 54 may sense and amplify data of a memory cell and store the data in a memory cell. The sense amplifier 54 may be implemented by a cross-coupled amplifier connected between the bit line and the complementary bit line included in the memory cell array 22A.

Data DQ input through the data input/output circuit 66 may be written to the memory cell array 22A based on an address signal ADD. The data DQ read from the memory cell array 22A based on the address signal ADD may be output to the outside through the data input/output circuit 66. The address signal ADD may be input to the address buffer 64 to designate a memory cell to write or read data. The address buffer 64 may temporarily store the address signal ADD that is externally input.

The row decoder 52 may decode a row address of the address signal ADD output from the address buffer 64 to designate a word line connected to the memory cell to write or read data. In other words, the row decoder 52, in a data write or read mode, may enable an appropriate word line by decoding a row address output from the address buffer 64. Furthermore, the row decoder 52, in a self-refresh mode, may enable an appropriate word line by decoding a row address generated from an address counter.

The column decoder 56 may decode a column address of the address signal ADD output from the address buffer 64, to designate a bit line connected to the memory cell to write or read data. The memory cell array 22A may output data from, or write data to, a memory cell designated by the row and column addresses.

The command decoder 60 may receive a command signal CMD that is externally applied, and may decode the signal to internally generate a decoded command signal, for example, a self-refresh entrance command or a self-refresh exit command.

The MRS/EMRS circuit 62 may set an internal mode register in response to a MRS/EMRS command and the address signal ADD to designate an operation mode of the integrated circuit device 10.

Although not illustrated in FIG. 2, the integrated circuit device 10 may further include a clock circuit for generating a clock signal, and/or a power circuit for receiving an externally applied power voltage and generating or distributing an internal voltage, etc.

The self-refresh control circuit 58 may control a self-refresh operation of the integrated circuit device 10 in response to a command output from the command decoder 60. The command decoder 60 may include an address counter, a timer, and/or a core voltage generator. The address counter may generate a row address to designate a row address that is subject to the self-refresh and apply the generated row address to the row decoder 52, in response to a self-refresh entrance command output from the command decoder 60. The address counter may stop a counting operation in response to the self-refresh exit command output from the command decoder 60.

Figure 3:
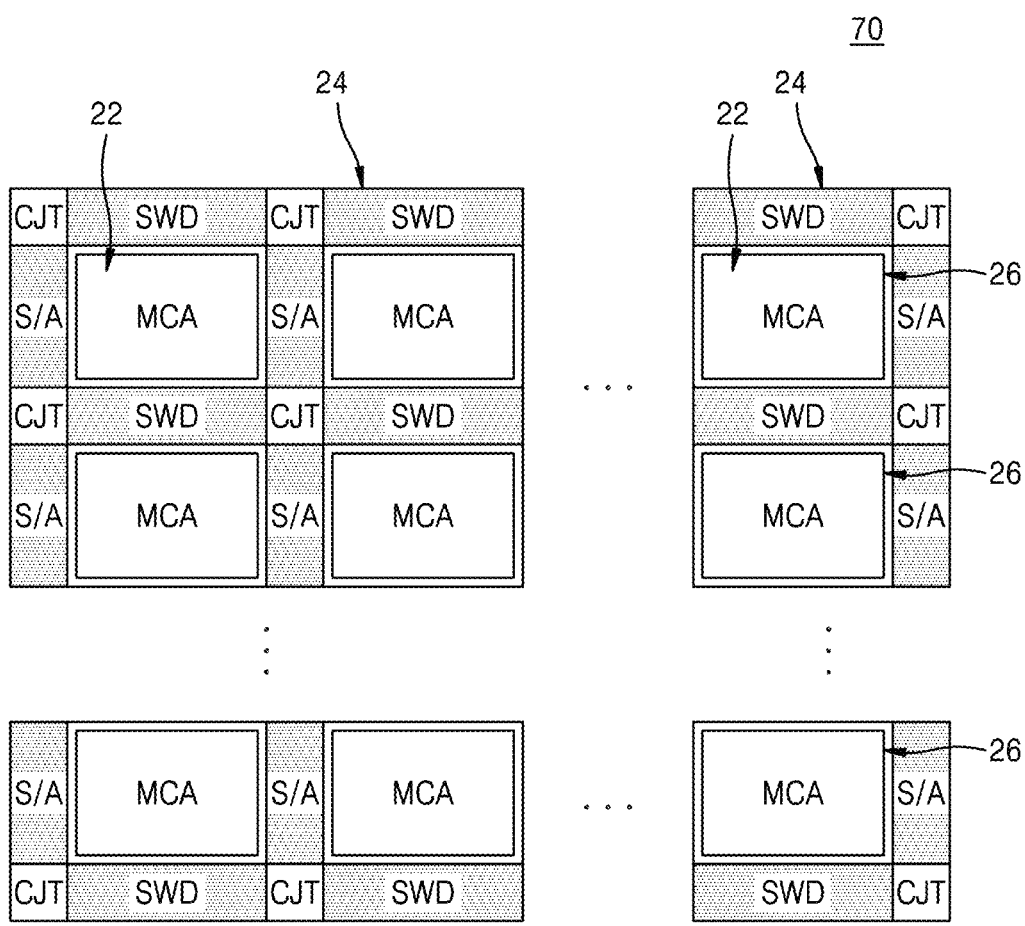
FIG. 3 is a schematic plan view of a configuration of an integrated circuit device according to another embodiment.

FIG. 3 is a schematic plan view of a configuration of an integrated circuit device 70 according to another embodiment. In FIGS. 1 and 3, like reference numerals denote like constituent elements, and thus redundant descriptions thereof are omitted.

Referring to FIG. 3, the integrated circuit device 70 may include a plurality of the first areas 22. The first areas 22 may be surrounded by the second area 24 with the interface area 26 therebetween. In the integrated circuit device 70, each of the first areas 22 may be a memory cell array area (MCA) of the DRAM device, and the second area 24 may be a peripheral circuit area of the DRAM device.

In the first areas 22, the MCA may include the memory cell array 22A described with reference to FIG. 2. Each of the first areas 22 may be surrounded by the interface area 26.

The second area 24 may include a sub-word line driver block SWD, a sense amplifier block S/A, and a conjunction block CJT. In the second area 24, a plurality of sub-word line driver blocks SWD may be arranged in a word line direction of the MCA, and a plurality of sense amplifier blocks S/A may be arranged in a bit line direction. A plurality of bit-line sense amplifiers may be arranged in the sense amplifier block S/A. The conjunction block CJT may be arranged at a position where the sub-word line driver block SWD and the sense amplifier block S/A intersect with each other. Power drivers for driving the bit-line sense amplifiers and ground drivers may be alternately arranged in the conjunction block CJT.

Although not illustrated in FIG. 3, a peripheral circuit such as an inverter chain, an input/output circuit, etc. may be further formed in the second area 24.

Figure 4:
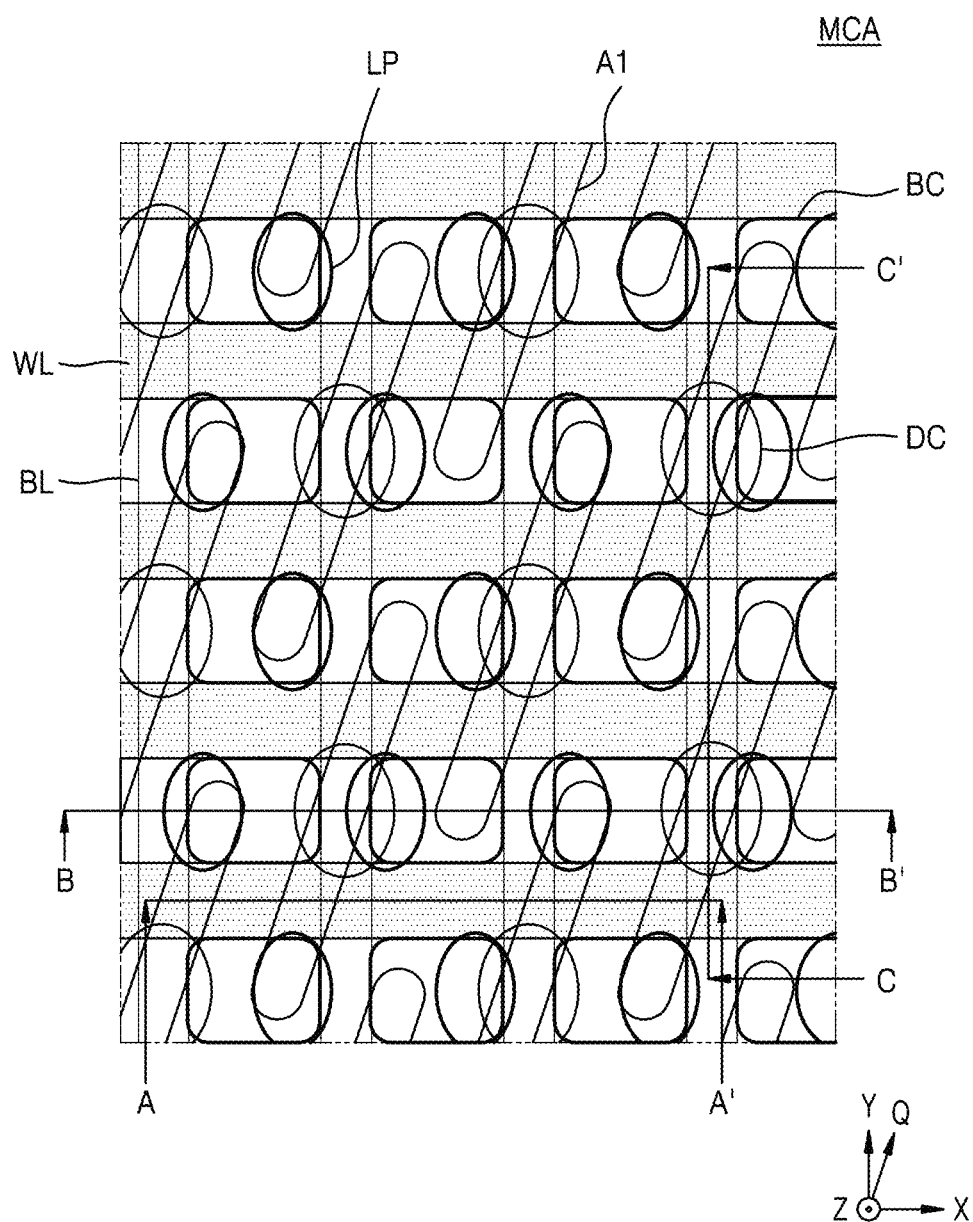
FIG. 4 is a schematic planar layout for explaining main configurations of a memory cell array area shown in FIG. 3.

FIG. 4 is a schematic planar layout for explaining main configurations of an MCA shown in FIG. 3.

Referring to FIG. 4, the MCA may include a plurality of active areas A1. The active areas A1 may be arranged to have a major axis extending in an inclined direction (Q direction) with respect to a first direction (X direction) and a second direction (Y direction). Some of the active areas A1 may be arranged linearly in the first direction (X direction). Some other of the active areas A1 may be arranged linearly along the second direction (Y direction).

A plurality of word lines WL may parallelly extend in the first direction (X direction) across the active areas A1. A plurality of bit lines BL may parallelly extend, above the word lines WL, in the second direction (Y direction) crossing the first direction (X direction). The bit lines BL may be connected to the active areas A1 via a direct contact (DC).

A plurality of buried contacts BC may be formed between two adjacent bit lines BL of the plurality of bit lines BL. The buried contacts BC may be arranged linearly in the first direction (X direction) and the second direction (Y direction). A plurality of landing pads LP may be formed on the buried contacts BC. The buried contacts BC and the landing pads LP may connect a lower electrode (not shown) of a capacitor formed above the bit lines BL to the active areas A1. Each of the landing pads LP may be arranged to partially overlap the buried contacts BC.

Figure 5A:
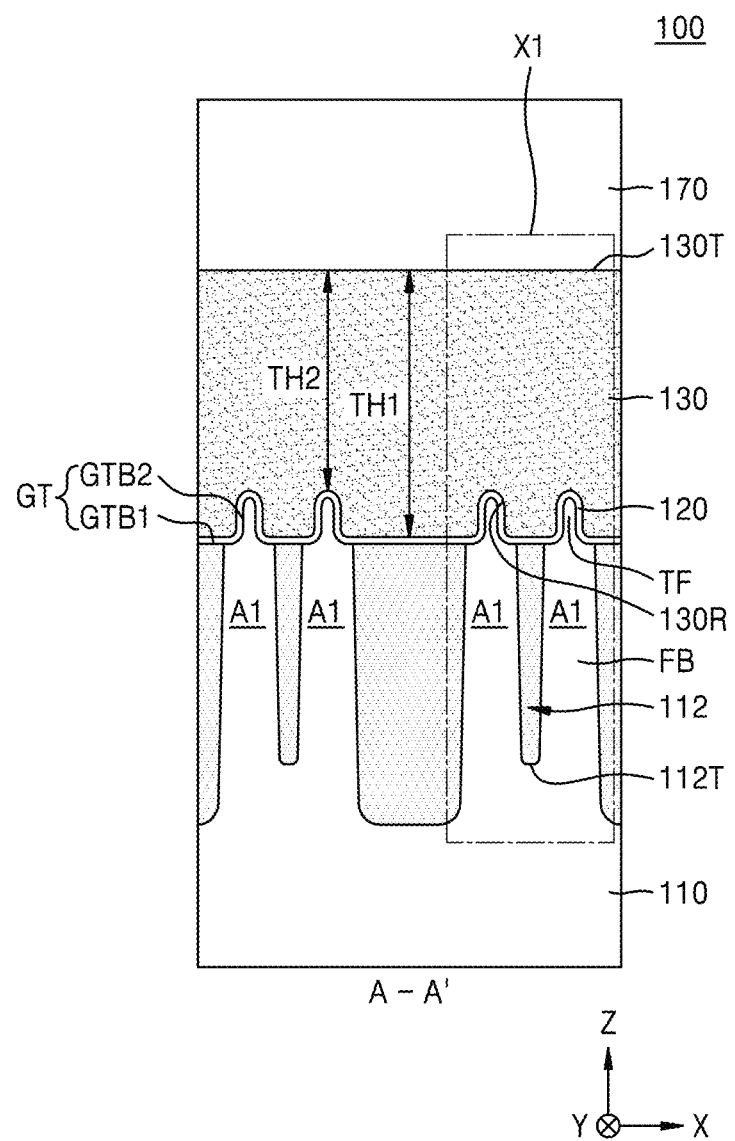
Figure 5B:
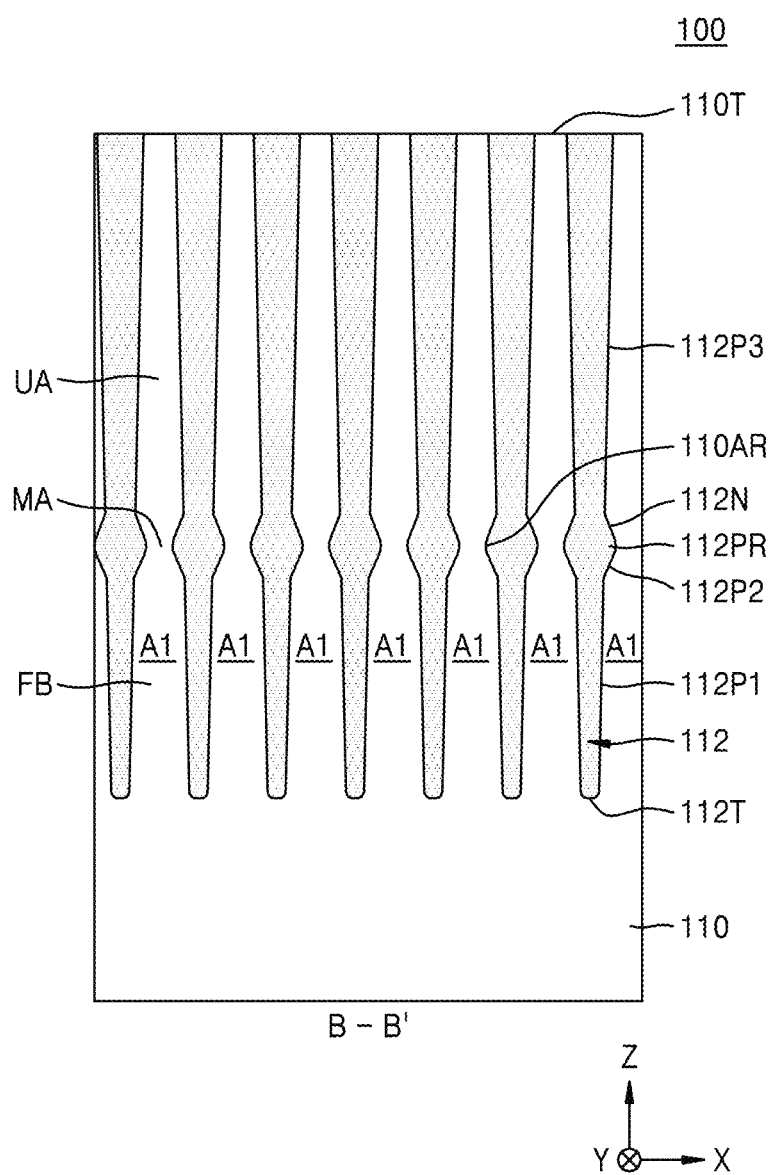
Figure 5C:
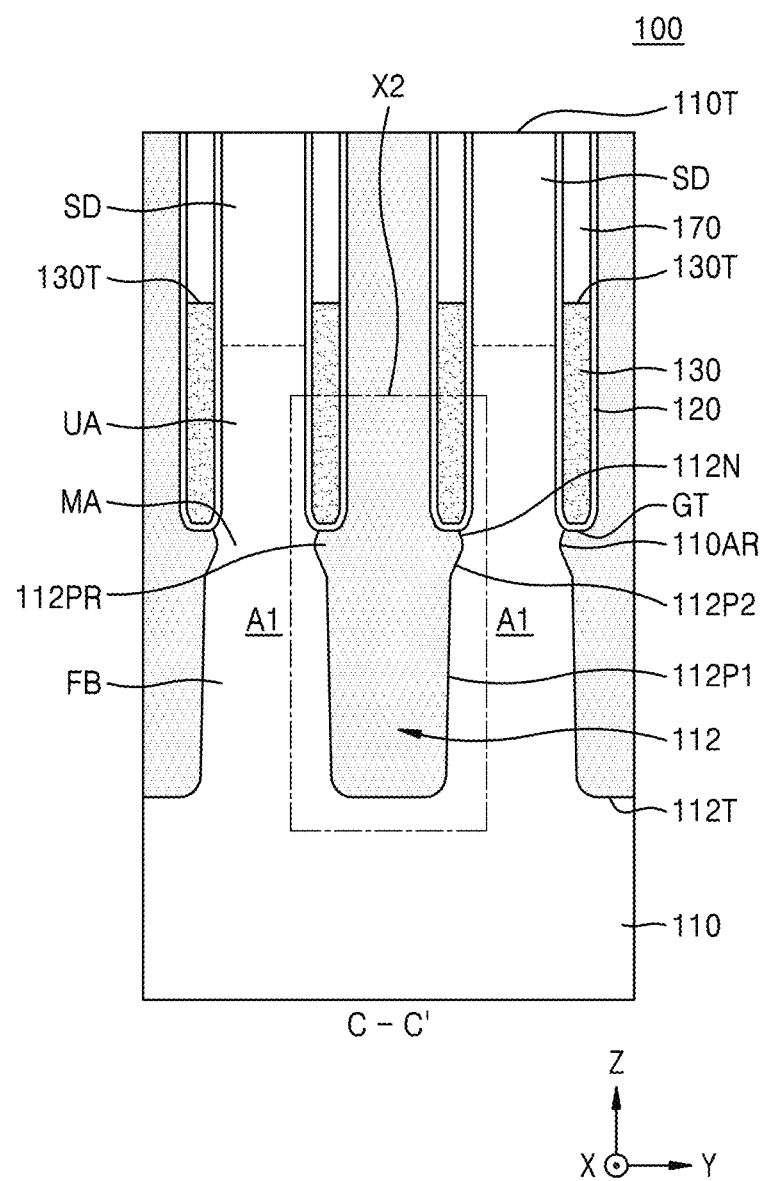

FIGS. 5A to 5C illustrate main configurations of an integrated circuit device 100 according to an embodiment, in which FIG. 5A is a cross-sectional view of some configurations, taken along line A-A' of FIG. 4, FIG. 5B is a cross-sectional view of some configurations, taken along line B-B' of FIG. 4, and FIG. 5C is a cross-sectional view of some configurations, taken along line C-C' of FIG. 4; In FIGS. 4 and 5A to 5C, like reference numerals denote like constituent elements, and thus redundant descriptions thereof are omitted.

Referring to FIGS. 5A to 5C, the integrated circuit device 100 may form a part of the MCA of FIG. 3, and may have the planar layout of FIG. 4.

The integrated circuit device 100 may include a substrate 110 in which a device isolation trench 112T for defining the active areas A1 is formed. A device isolation film 112 filling the device isolation trench 112T is formed around the active areas A1 on the substrate 110.

The substrate 110 may have the same configuration as the substrate 12 described with reference to FIG. 1.

The active areas A1, as illustrated in FIG. 4, may be repeatedly formed by being spaced apart from each other in the X direction and Y direction. Each of the active areas A1 may have a shape extending in an inclined direction to have a major axis extending in another direction (Q direction in FIG. 4) different from the X direction and the Y direction.

The device isolation film 112 may formed in a silicon oxide film, a silicon nitride film, or a combination thereof.

A plurality of gate trenches GT extending in the first direction (X direction) across the active areas A1 and the device isolation film 112 are formed in the active areas A1 and the device isolation film 112. The gate trenches GT may have a shape of a plurality of lines parallelly extending in the X direction.

A gate dielectric film 120 covering an inner wall of each of the gate trenches GT, and a conductive line 130 filling a part of each of the gate trenches GT above the gate dielectric film 120, are formed in each of the gate trenches GT. The conductive line 130 may form the word line WL of FIG. 4. An insulating capping pattern 170 covering the conductive line 130 may be formed in each of the gate trenches GT.

On a lower surface of each of the gate trenches GT, a level of a portion where the active areas A1 of the substrate 110 are exposed may be higher than a level of a portion where the device isolation film 112 is exposed. The lower surface of the conductive line 130 may have an uneven shape corresponding to a lower surface profile of each of the gate trenches GT, and a saddle FINFET structure may be formed on the active areas A1. In the present specification, the term "level" may signify a height in a vertical direction (Z direction).

Figure 6:
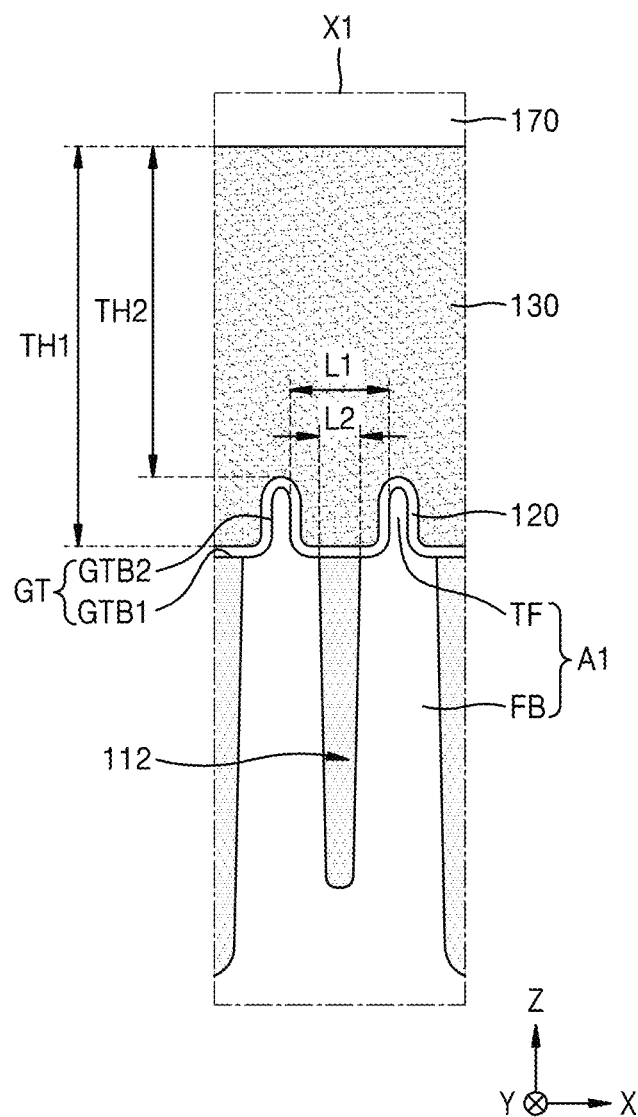
FIG. 6 is an enlarged cross-sectional view of a portion X1 of FIG. 5A.

FIG. 6 is an enlarged cross-sectional view of a portion X1 of FIG. 5A.

Referring to FIGS. 5A to 5C and FIG. 6, each of the active areas A1 may include a fin body portion FB located under the conductive line 130, and a thinner fin portion TF integrally connected to the fin body portion FB and upwardly protruding from the fin body portion FB toward the conductive line 130 in a vertical direction (Z direction). The thinner fin portion TF has a width in the first direction (X direction) that is less than a width of the fin body portion FB. Accordingly, a distance L1 between the thinner fin portions TF of the two neighboring active areas A1 in the first direction (X direction) is greater than a distance L2 between the fin body portions FB of the two neighboring active areas A1. As illustrated in FIGS. 5A and 6, the thinner fin portion TF may have a round top portion, but the present inventive concepts is not limited thereto. The shape of the top portion of the thinner fin portion TF may be variously changed within the scope of the technical concepts of the present inventive concepts, and a detailed example thereof is described later with reference to FIG. 9. Similarly, the overall profile of the thinner fin portion TF and the fin body portions FB may be any overall profile that results in the distance L1 between the thinner fin portions TF of two neighboring active areas A1 in the first direction (X direction) to be greater than a distance L2 between the fin body portions FB of the two neighboring active areas A1.

Each of the gate trenches GT may include a first bottom GTB1 where the device isolation film 112 is exposed and a second bottom GTB2 where a surface of the thinner fin portion TF and an upper surface of the fin body portion FB are exposed. The first bottom GTB1 may be located at a level lower than the second bottom GTB2.

A thickness TH1 of the conductive line 130 on the first bottom GTB1 of each of the gate trenches GT may be greater than a thickness TH2 of the conductive line 130 on the second bottom GTB2 of each of the gate trenches GT.

The gate dielectric film 120 may cover an inner surface of each of the gate trenches GT to contact the active areas A1 and the device isolation film 112. The gate dielectric film 120 may contact the surface of the thinner fin portion TF and the upper surface of the fin body portion FB, above the active areas A1.

The gate dielectric film 120 may be formed in a silicon oxide film, a silicon nitride film, a silicon oxynitride film, an oxide/nitride/oxide (ONO) film, or a high-k dielectric film having a dielectric constant higher than that of a silicon oxide film. The high-k dielectric film may have a dielectric constant of about 10-25, and may include, for example, HfO2, Al2O3, HfAl3, Ta2O3, or TiO2.

The conductive line 130 may be formed of metal, a metal nitride, a metal carbide, or a combination thereof. In some embodiments, the conductive line 130 may be formed of Ti, TiN, Ta, TaN, W, WN, TiSiN, WSiN, or a combination thereof.

The insulating capping pattern 170 may be formed in a silicon nitride film, a silicon oxynitride film, a silicon oxide film, or a combination thereof.

As illustrated in FIG. 5A, the conductive line 130 may include a recess bottom 130R surrounding the thinner fin portion TF.

As illustrated in FIGS. 5B and 5C, each of the active areas A1 may have a side wall in which a lateral recess 110AR is formed. The lateral recess 110AR may be formed at an approximately same level as that of the thinner fin portion TF. The lateral recess 110AR may have a shape extending long in a horizontal direction along a circumferential direction of the active areas A1.

Each of the active areas A1 may further include an upper active area UA and a middle active area MA. The middle active area MA may be connected between the fin body portion FB and the upper active area UA. In the active areas A1, at least a lower portion of the middle active area MA may be located at the same level as that of the thinner fin portion TF. In the horizontal direction, a width of the middle active area MA may be less than the width of the fin body portion FB and a width of the upper active area UA.

The device isolation film 112 may have a side wall on which a laterally protruding insulation portion 112PR protruding toward the lateral recess 110AR of the active areas A1 is formed. The side wall of the device isolation film 112 may include portions 112P1, 112P2, and 112P3 having a positive profile such that a width of the device isolation film 112 in the horizontal direction increases toward the uppermost surface of the active areas A1, that is, a top surface 110T of the substrate 110, and a portion 112N having a negative profile such that the width of the device isolation film 112 in the horizontal direction decreases toward the top surface 110T of the substrate 110.

As illustrated in FIG. 5C, the conductive lines 130 each may have side walls facing the active areas A1. The insulating capping pattern 170 may have side walls facing the active areas A1. A source/drain area SD may be formed at both sides of the conductive line 130 in the active areas A1. A top surface 130T of the conductive line 130 may be located at a level lower than the uppermost surface of the active areas A1, that is, the top surface 110T of the substrate 110.

In some embodiments, the integrated circuit device 100 may further include an insulating thin film 114 (see FIG. 10F) covering the top surface 110T of the substrate 110. The insulating thin film 114 may be formed of the same material as the insulation material forming the device isolation film 112.

Figure 7:
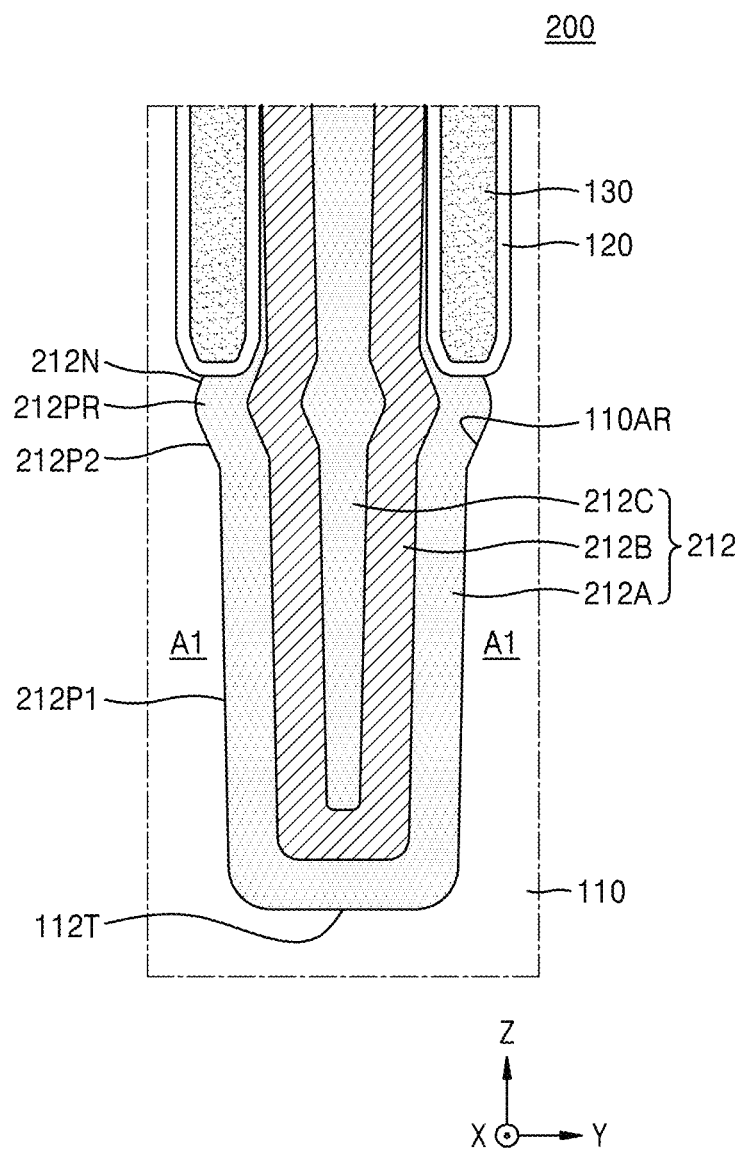
FIG. 7 is a cross-sectional view of main configurations of an integrated circuit device according to another embodiment.

FIG. 7 is a cross-sectional view of main configurations of an integrated circuit device 200 according to another embodiment. An area corresponding to a portion X2 of FIG. 5C is illustrated enlarged in FIG. 7. In FIGS. 5A to 5C and FIG. 7, like reference numerals denote like constituent elements, and thus redundant descriptions thereof are omitted.

Referring to FIG. 7, the integrated circuit device 200 has approximately the same configuration as the integrated circuit device 100 illustrated in FIGS. 5A to 5C. However, the integrated circuit device 200 may include a device isolation film 212 having a multilayer structure, instead of the device isolation film 112 of the integrated circuit device 100.

The device isolation film 212 may include a first insulating liner 212A, a second insulating liner 212B, and/or a gap-fill insulating film 212C which are sequentially formed in the device isolation trench 112T. In the device isolation trench 112T, the first insulating liner 212A and the second insulating liner 212B may have a structure surrounding the gap-fill insulating film 212C. In some embodiments, although the first insulating liner 212A and the gap-fill insulating film 212C may be formed in a silicon oxide film, and the second insulating liner 212B is formed in a silicon nitride film, materials forming the first insulating liner 212A, the second insulating liner 212B, and/or the gap-fill insulating film 212C are not limited to the above descriptions.

The device isolation film 212 may have a side wall on which a laterally protruding insulation portion 212PR protruding toward the lateral recess 110AR of the active areas A1 is formed. The side wall of the device isolation film 212 may include portions 212P1 and 212P2 having a positive profile such that a width of the device isolation film 212 in the horizontal direction increases toward the top surface 110T of the substrate 110 (see FIG. 5C), and a portion 212N having a negative profile such that a width of the device isolation film 212 in the horizontal direction decreases toward the top surface 110T of the substrate 110.

Figure 8A:
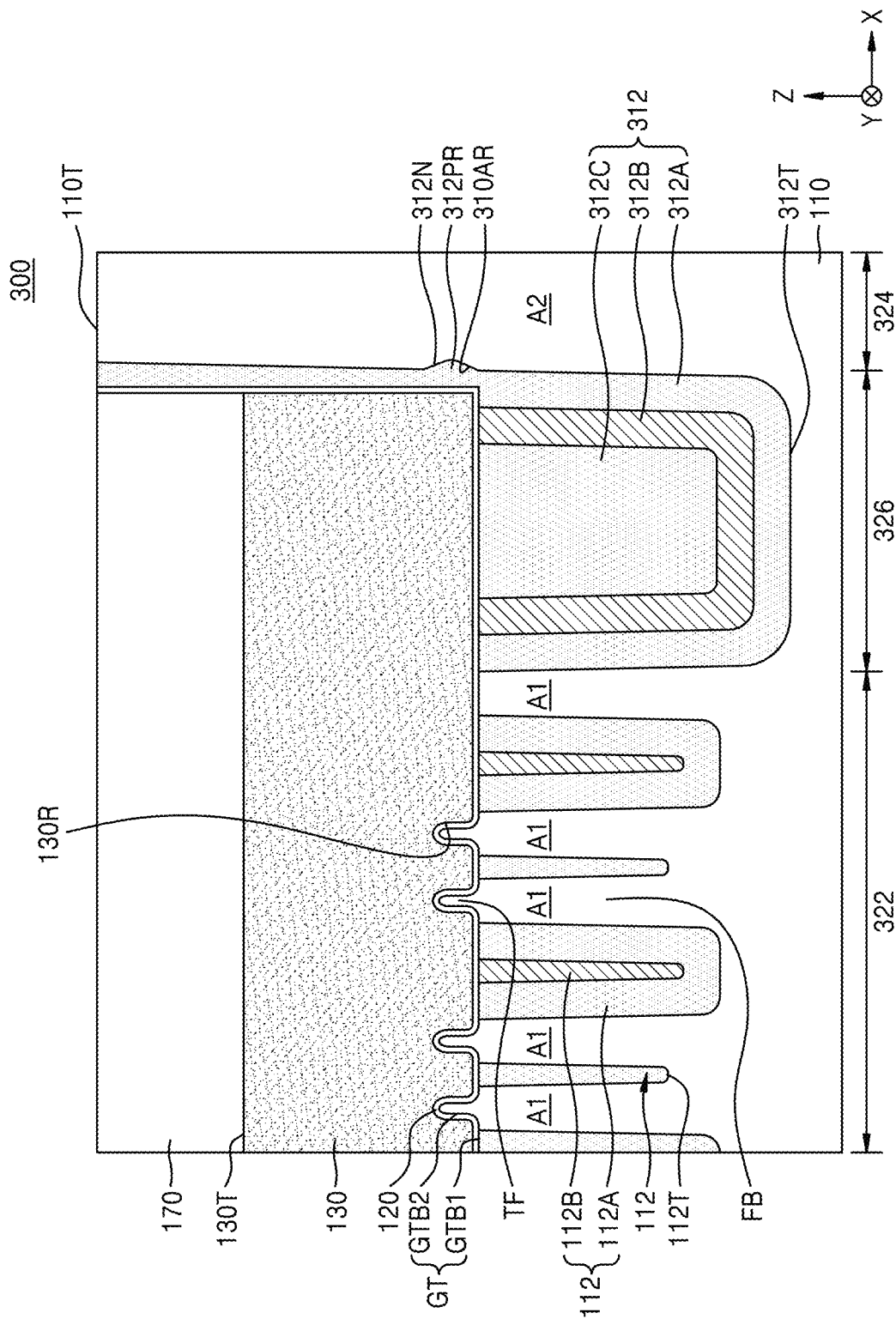
FIGS. 8A and 8B are cross-sectional views of main configurations of an integrated circuit device according to another embodiment.
Figure 8B:
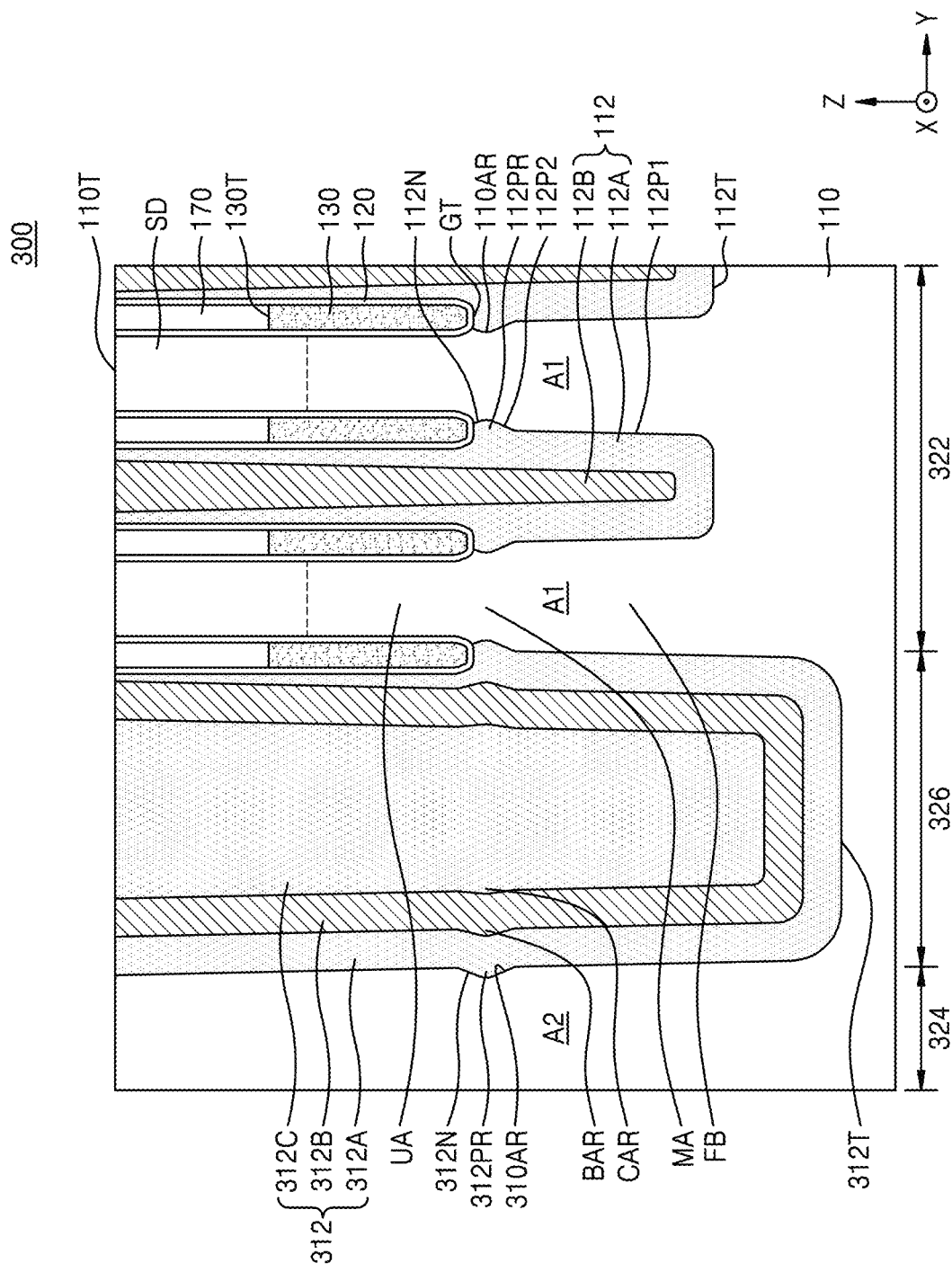

FIGS. 8A and 8B are cross-sectional views of main configurations of an integrated circuit device 300 according to another embodiment. FIGS. 8A and 8B illustrate sectional configurations of a cell array area 322, a peripheral circuit area 324, and an interface area 326. The cell array area 322 may be a part of the first area 22 described with reference to FIGS. 1 to 3. The peripheral circuit area 324 and the interface area 326 may be parts of the second area 24 and the interface area 26 described with reference to FIGS. 1 and 3, respectively.

A sectional configuration illustrated in FIG. 8A may correspond to a partial area of the section taken along the line A-A' of FIG. 4 and to a partial area of the interface area 326 adjacent thereto, and a sectional configuration illustrated in FIG. 8B may correspond to a partial area of the section taken along the line C-C' of FIG. 4 and to a partial area of the interface area 326 adjacent thereto.

In FIGS. 8A and 8B and FIGS. 5A to 5C, like reference numerals denote like constituent elements, and thus redundant descriptions thereof are omitted.

Referring to FIGS. 8A and 8B, the integrated circuit device 300 have approximately the same configuration as the integrated circuit device 100 illustrated in FIGS. 5A to 5C. However, the integrated circuit device 300 may further include an interface device isolation film 312 filling an interface trench 312T that is formed in the substrate 110 in the interface area 326.

An active area A2 may be defined in the peripheral circuit area 324 of the substrate 110 by the interface trench 312T and the interface device isolation film 312.

As illustrated in FIG. 8B, in the peripheral circuit area 324, the active area A2 may have a side wall in which a lateral recess 310AR is formed. The lateral recess 310AR may be formed at an approximately same level as that of the thinner fin portion TF included in the active areas A1 of the cell array area 322. The lateral recess 310AR in the active area A2 of the peripheral circuit area 324 may have a shape that extends long in the horizontal direction along the circumferential direction of the active area A2.

The interface device isolation film 312 may have a side wall on which a laterally protruding insulation portion 312PR protruding toward the lateral recess 310AR of the active area A2 in the peripheral circuit area 324 is formed. The laterally protruding insulation portion 312PR may include a portion protruding toward the lateral recess 110AR of the active areas A1, and a portion protruding toward the lateral recess 310AR of the active area A2.

The side wall of the interface device isolation film 312 may include a portion 312N having a negative profile such that a width of the interface device isolation film 312 in the horizontal direction decreases toward the top surface 110T of the substrate 110.

The interface device isolation film 312 may extend along the periphery of the cell array area 322 to have a shape surrounding the cell array area 322 when seen in the planar view. A with of the interface device isolation film 312 in the horizontal direction may be greater than a width of the device isolation film 112 arranged in the cell array area 322 in the horizontal direction.

In the interface area 326, the interface device isolation film 312 may include a first insulating liner 312A, a second insulating liner 312B, and a gap-fill insulating film 312C filling the interface trench 312T in the second insulating liner 312B, which are sequentially formed on an inner wall of the interface trench 312T.

In the cell array area 322, a part of the device isolation film 112 may have a structure in which a first insulating film 112A and a second insulating film 112B are sequentially stacked. In the device isolation trench 112T, an area having a relatively narrow width in the horizontal direction may be filled with the first insulating film 112A only, and an area having a relatively large width in the horizontal direction may be filled with the first insulating film 112A and the second insulating film 112B. The first insulating film 112A forming the device isolation film 112 may be formed of the same material as the first insulating liner 312A forming the interface device isolation film 312. The second insulating film 112B forming the device isolation film 112 may be formed of the same material as the second insulating liner 312B forming the interface device isolation film 312.

As illustrated in FIG. 8B, the laterally protruding insulation portion 312PR formed on the side wall of the interface device isolation film 312 may be a part of the first insulating liner 312A. The second insulating liner 312B of the interface device isolation film 312 may include a protruding portion BAR. The protruding portion BAR may protrude toward the laterally protruding insulation portion 312PR and extend long along the circumferential direction of the second insulating liner 312B at an approximately same level as the thinner fin portion TF included in the active areas A1 of the cell array area 322. The protruding portion BAR may include a portion protruding toward the lateral recess 110AR of the active areas A1, a portion protruding toward the thinner fin portion TF of the active areas A1, and a portion protruding toward the lateral recess 310AR of the active area A2. The gap-fill insulating film 312C of the interface device isolation film 312 may include a protruding portion CAR. The protruding portion CAR may protrude toward the laterally protruding insulation portion 312PR and extend long in the horizontal direction along the circumferential direction of the gap-fill insulating film 312C at an approximately same level as the thinner fin portion TF included in the active areas A1 of the cell array area 322. The protruding portion CAR may include a portion protruding toward the lateral recess 110AR of the active areas A1, a portion protruding toward the thinner fin portion TF of the active areas A1, and a portion protruding toward the lateral recess 310AR of the active area A2.

In some embodiments, each of the first insulating film 112A, the first insulating liner 312A, and the gap-fill insulating film 312C may be formed in an oxide film, and the second insulating film 112B and the second insulating liner 312B may be formed in a nitride film. In some embodiments, the oxide film forming the first insulating film 112A and the first insulating liner 312A may be a silicon oxide film formed by an atomic layer deposition (ALD) process. In some embodiments, the second insulating film 112B and the second insulating liner 312B may be a silicon nitride film. In some embodiments, the silicon oxide film forming the gap-fill insulating film 312C may be a tonen silazene (TOSZ) oxide film, a high density plasma (HDP) oxide film, or an undoped silicate glass (USG) oxide film. In other embodiments, the oxide film forming the gap-fill insulating film 312C may be a spin-on-glass (SOG) oxide film including silicate, siloxane, methyl silsesquioxane (MSQ), hydrogen silsesquioxane (HSQ), polysilazane, or a combination thereof.

Figure 9:
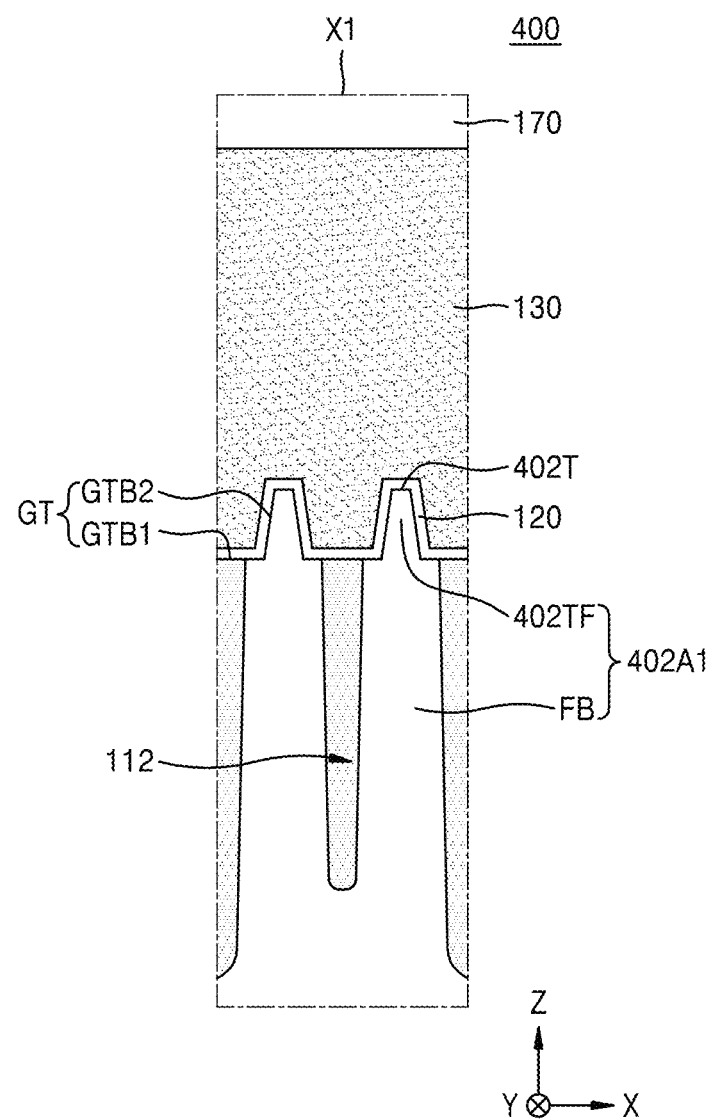
FIG. 9 is a cross-sectional view of main configurations of an integrated circuit device according to another embodiment.

FIG. 9 is a cross-sectional view of main configurations of an integrated circuit device 400 according to another embodiment. A portion corresponding to the portion X1 of FIG. 5A is illustrated enlarged in FIG. 9. In FIG. 9 and FIGS. 5A to 5C, like reference numerals denote like constituent elements, and thus redundant descriptions thereof are omitted.

Referring to FIG. 9, the integrated circuit device 400 has approximately the same configuration as the integrated circuit device 100 illustrated in FIGS. 5A to 5C. However, an active area 402A1 of the integrated circuit device 400 may have a thinner fin portion 402TF having a top surface 402T that is flat, instead of the thinner fin portion TF of FIG. 5A and FIG. 6. A detailed configuration of the active area 402A1 having the thinner fin portion 402TF is approximately the same as that of the active areas A1 having the thinner fin portion TF described with reference to FIG. 5A to FIG. 6.

FIGS. 10A to 10F are cross-sectional views showing a method of manufacturing an integrated circuit device according to an embodiment, in a process order. A method of manufacturing the integrated circuit device 300 of FIGS. 8A and 8B is exemplarily described with reference to FIGS. 10A to 10F.

Figure 10A:
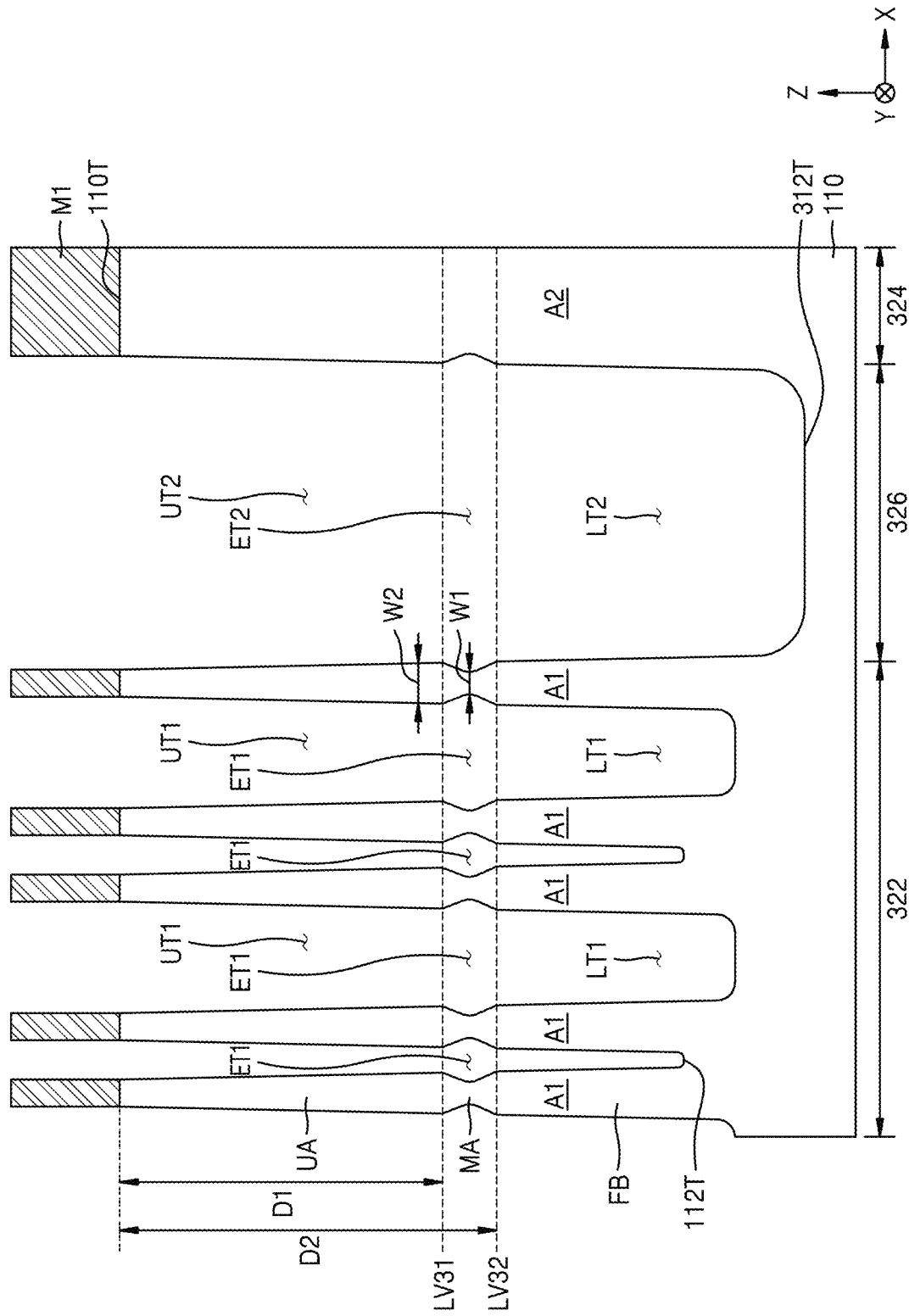
FIGS. 10A to 10F are cross-sectional views showing a method of manufacturing an integrated circuit device, according to an embodiment, in a process order.

Referring to FIG. 10A, the substrate 110 including the cell array area 322, the peripheral circuit area 324, and the interface area 326 therebetween is prepared.

A mask pattern M1 is formed on the substrate 110. In the cell array area 322, the device isolation trench 112T is formed in the substrate 110 and the interface trench 312T is formed in the substrate 110 by etching the substrate 110 by using the mask pattern M1 as an etch mask. The active areas A1 may be defined in the cell array area 322 and the active area A2 may be defined in the peripheral circuit area 324, by the device isolation trench 112T and the interface trench 312T.

The mask pattern M1 may be formed to cover a part of the cell array area 322 and the peripheral circuit area 324. The mask pattern M1 may be a hard mark including an oxide film, a polysilicon film, or a combination thereof.

Each of the device isolation trench 112T and the interface trench 312T may be formed to include trench areas ET1 and ET2 extending from the top surface 110T of the substrate 110 to a level of a certain depth.

In some embodiments, the extended trench areas ET1 and ET2 may be formed at a level lower than a first depth D1 from the top surface 110T of the substrate 110. In some embodiments, to form the device isolation trench 112T and the interface trench 312T including the extended trench areas ET1 and ET2, upper device isolation trench areas UT1 and UT2 may be formed by performing an anisotropic etching process on the substrate 110 to a first level LV31 that is the first depth D1 from the top surface 110T of the substrate 110. Each of the upper device isolation trench areas UT1 and UT2 may have a side wall having a positive profile such that a width of each of the upper device isolation trench areas UT1 and UT2 in the horizontal direction increases toward the top surface 110T of the substrate 110. Next, from the first level LV31 to a second level LV32 that is a second depth D2 deeper than the first depth D1 from the top surface 110T of the substrate 110, the extended trench areas ET1 and ET2 may be formed by performing an isotropic etching process on the substrate 110. Each of the extended trench areas ET1 and ET2 may include a portion having a negative profile such that a width of each of the extended trench areas ET1 and ET2 in the horizontal direction decreases toward the top surface 110T of the substrate 110. Then, lower device isolation trench areas LT1 and LT2 may be formed by performing an anisotropic etching process on the substrate 110 from the second level LV32 until the formation of the device isolation trench 112T and the interface trench 312T is completed. Each of the lower device isolation trench areas LT1 and LT2 may have a side wall having a positive profile such that a width of each of the lower device isolation trench areas LT1 and LT2 in the horizontal direction increases toward the top surface 110T of the substrate 110.

The anisotropic etching process and the isotropic etching process each may be performed in a dry method. In some embodiments, when the substrate 110 is formed of silicon (Si), an etching apparatus using inductively coupled plasma (ICP) may be used to perform the anisotropic etching process and the isotropic etching process. For example, the anisotropic etching process may be performed by using plasma obtained from a Cl2 gas. The isotropic etching process may be performed by using plasma obtained from a mixed gas of a Cl2 gas and a NF3 gas. The mixed gas may be a gas obtained by mixing a Cl2 gas and an NF3 gas at a volume ratio of about 5:1. The isotropic etching process for forming the extended trench areas ET1 and ET2 may use a higher pressure and a lower bias voltage than those used for the anisotropic etching process for forming the upper device isolation trench areas UT1 and UT2 and the lower device isolation trench areas LT1 and LT2. For example, a pressure of about 3 mT, a source power of about 300 W, and a bias voltage of about 850 V are used during the anisotropic etching process, and a pressure of about 20 mT, a source power of about 600 W, and a bias voltage of about 0 V may be used during the isotropic etching process. However, these are examples, and the technical concepts of the present inventive concepts are not limited thereto.

In some embodiments, while the anisotropic etching process and the isotropic etching process are performed, a cycle process in which an oxidation process for oxidizing an exposed surface of the substrate 110, and an etching process for removing a part of the substrate 110 to form the device isolation trench 112T and the interface trench 312T are alternatively repeated a plurality of times, may be performed.

After the device isolation trench 112T and the interface trench 312T are formed in the substrate 110, in the cell array area 322, each of the active areas A1 may include the fin body portion FB, the middle active area MA, and the upper active area UA. In some embodiments, in a horizontal direction, a width W1 of the middle active area MA may be less than a width W2 of the upper active area UA and greater than ½ of the width W2 of the upper active area UA.

Figure 10B:
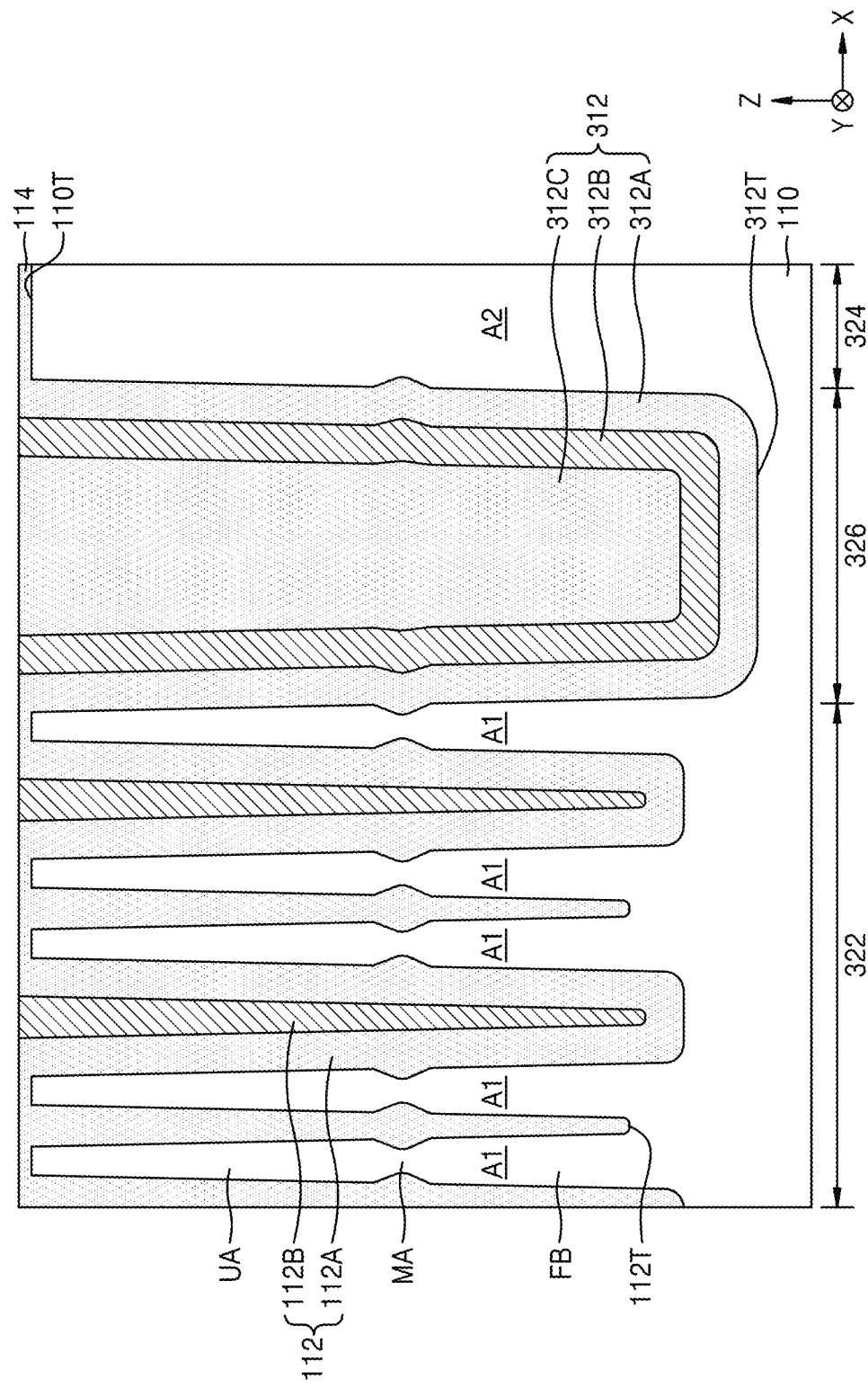

Referring to FIG. 10B, from a resultant of FIG. 10A, after the mask pattern M1 is removed, the device isolation film 112 filling the device isolation trench 112T and the interface device isolation film 312 filling the interface trench 312T are formed.

The device isolation film 112 and the interface device isolation film 312 may include the insulating thin film 114 covering the top surface 110T of the substrate 110. The insulating thin film 114 remaining on the top surface 110T of the substrate 110 may protect the surface of the substrate 110 in a subsequent process when an ion injection process to inject impurity ions into the substrate 110 is performed, or during a subsequent etching process.

Figure 10C:
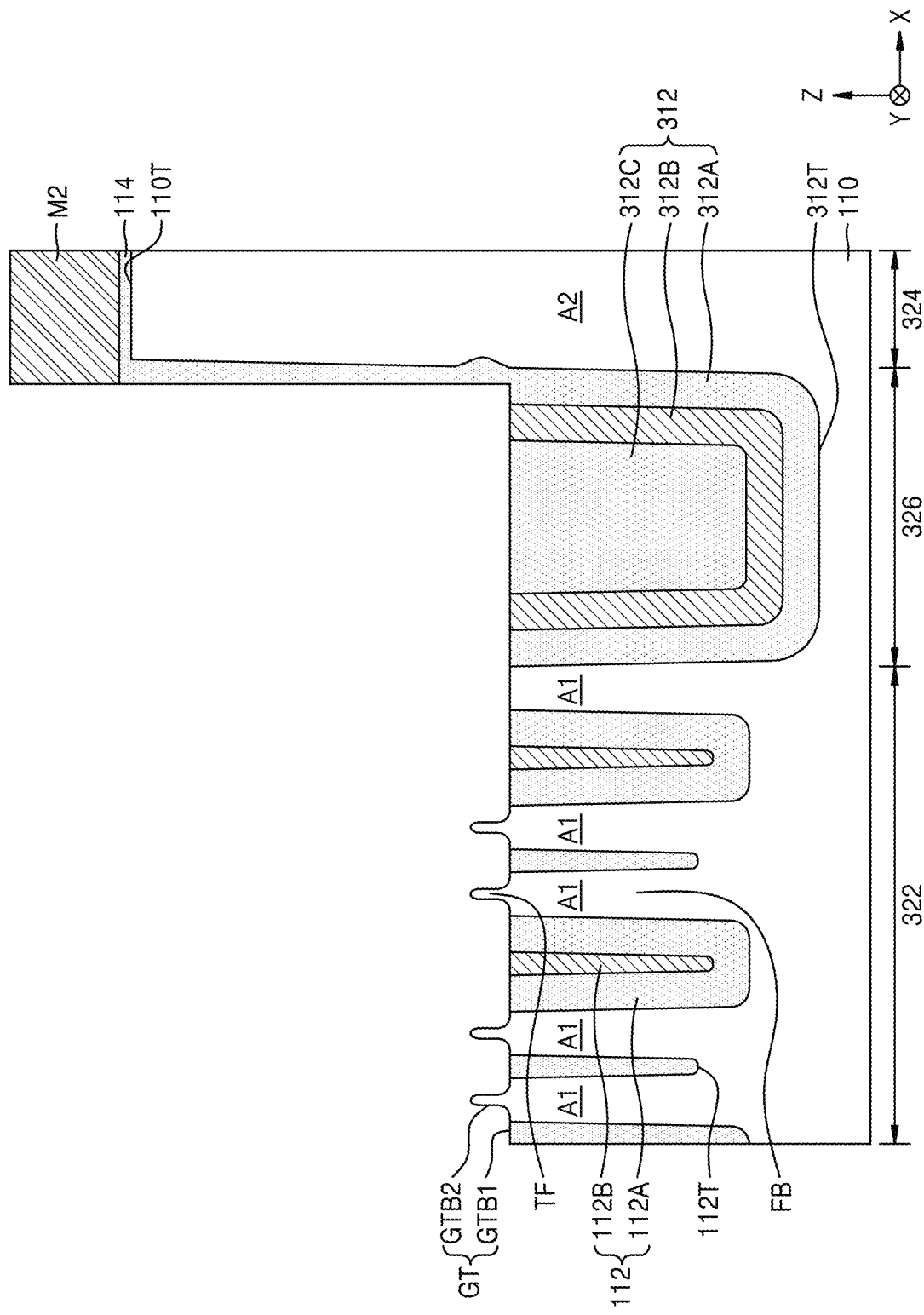

Referring to FIG. 10C, each of the gate trenches GT extending in the first direction (X direction) across the active areas A1, the device isolation film 112, and the interface device isolation film 312 is formed by etching a part of the substrate 110, a part of the device isolation film 112, and a part of the interface device isolation film 312, by using a mask pattern M2 as an etch mask.

In order to form each of the gate trenches GT, from the top surface 110T of the substrate 110 to the first level LV31 (see FIG. 10A) that is the first depth D1, the substrate 110, the device isolation film 112, and the interface device isolation film 312 may be etched at an approximately same etching speed. In other words, in an area exposed through the mask pattern M2, the upper active area UA is removed from the active areas A1 from the top surface 110T of the substrate 110, and the substrate 110, the device isolation film 112, and the interface device isolation film 312 may be etched at an approximately same etching speed until a point when the middle active area MA is exposed. Next, from a point when the middle active area MA of each of the active areas A1 is exposed, the etching process may be performed on a condition that an etching speed of the device isolation film 112 and the interface device isolation film 312 is greater than an etching speed of the substrate 110. In this state, while the device isolation film 112 and the interface device isolation film 312 are etched around the middle active area MA, a part of an exposed surface of the middle active area MA is further consumed, and thus the thinner fin portion TF may be formed. After each of the gate trenches GT is formed, the thinner fin portion TF and the fin body portion FB of each of the active areas A1 may be exposed from the bottom of each of the gate trenches GT. Each of the gate trenches GT may include the first bottom GTB1 where the device isolation film 112 is exposed, and the second bottom GTB2 where the surface of the thinner fin portion TF and the upper surface of the fin body portion FB are exposed. The first bottom GTB1 may be located at a level lower than the second bottom GTB2.

In some embodiments, by appropriately changing an etching atmosphere during the process of etching the device isolation film 112 and the interface device isolation film 312 around the middle active area MA, the thinner fin portion TF having a round top portion as illustrated in FIG. 10C or the thinner fin portion 402TF having the top surface 402T that is flat as illustrated in FIG. 9 may be formed.

The mask pattern M2 may be formed in an oxide film, an amorphous carbon layer (ACL), a SiON film, or a combination thereof.

Figure 10D:
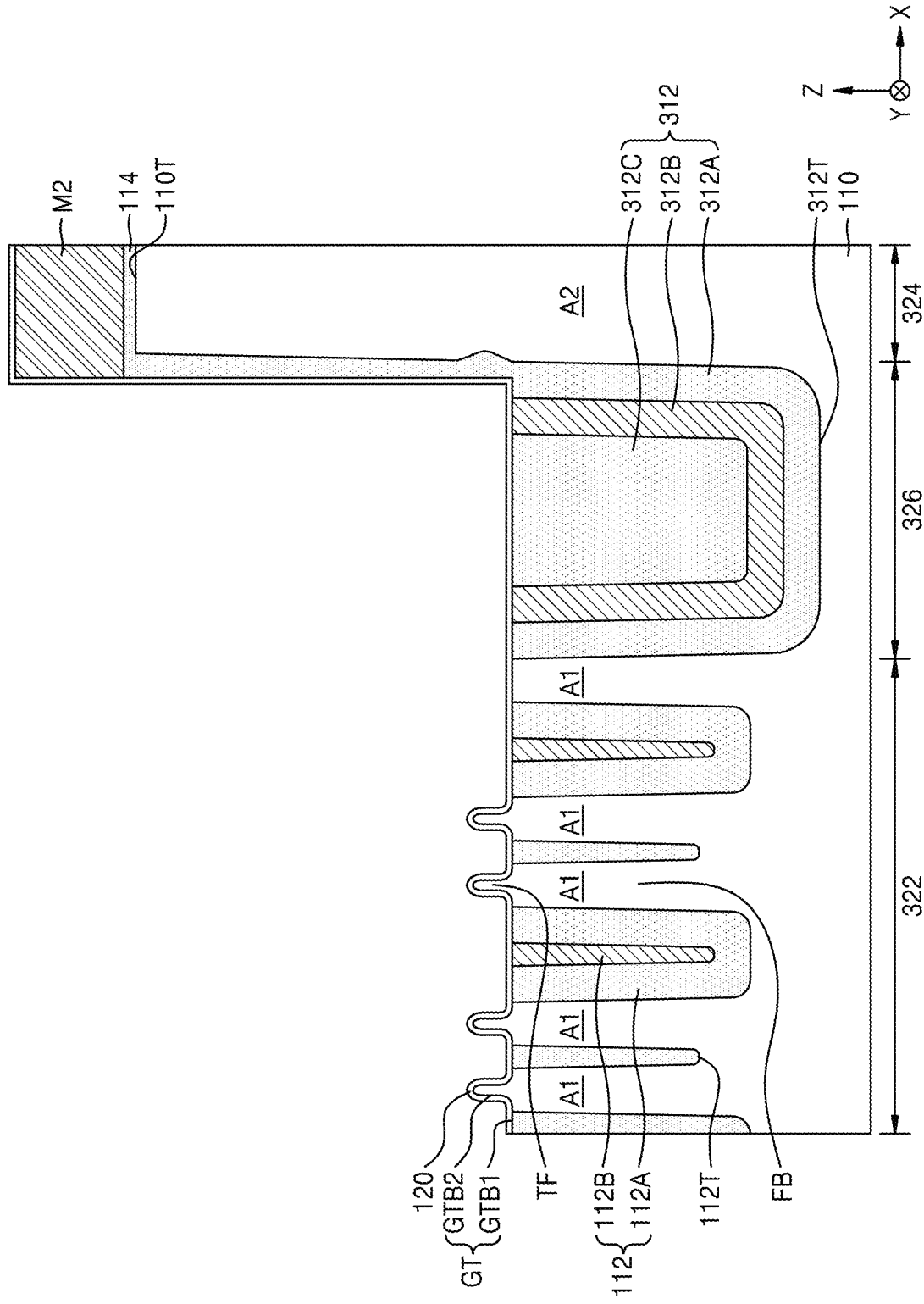

Referring to FIG. 10D, the gate dielectric film 120 conformally covering the inner wall of each of the gate trenches GT is formed on a resultant of FIG. 10C. The gate dielectric film 120 may be formed by using the ALD process.

Figure 10E:
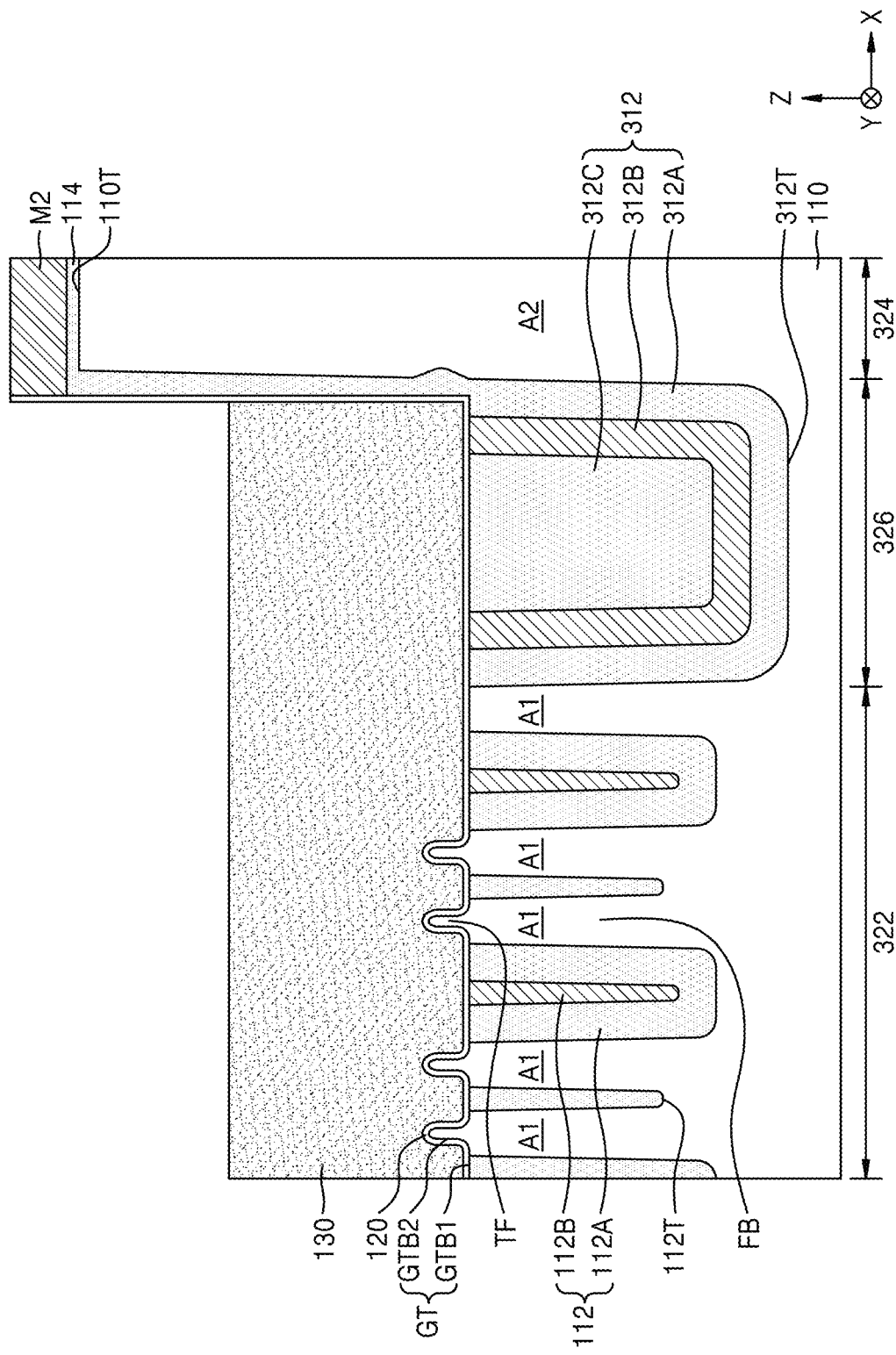

Referring to FIG. 10E, after a conductive layer (not shown) filling each of the gate trenches GT on the gate dielectric film 120 is formed, the conductive layer is etched back such that the conductive line 130 filling a part of each of the gate trenches GT remains from the conductive layer.

The conductive layer may have a structure in which a metal containing liner and a metal film are sequentially stacked. The metal containing liner may contact the gate dielectric film 120. The metal film may be spaced apart from the gate dielectric film 120 and surrounded by the metal containing liner. In some embodiments, the metal containing liner may be formed of TiN, and the metal film may be formed of W, but the present inventive concept is not limited thereto.

In the active areas A1, the thinner fin portion TF having a width less than a width of the fin body portion FB protrudes to the inside of each of the gate trenches GT. Accordingly, even when an interval between the active areas A1 in the cell array area 322 decreases much as the integrated circuit device is highly downscaled, a plurality of the thinner fin portion TF having a relatively small width protrudes to the inside of each of the gate trenches GT, and thus a space having a relatively large width may be secured between two neighboring thinner fin portion TF of a plurality of the thinner fin portions TF. Accordingly, while the conductive layer is formed to form the conductive line 130, the conductive layer may fill well, without a deposition defect such as a seam or void, the space between the two neighboring thinner fin portions TF that is a relatively narrow space compacted to other portion of the inner space of each of the gate trenches GT. Accordingly, the defective deposition problem due to a narrow interval between the active areas A1 may be addressed and an area where the thinner fin portion TF and the conductive line 130 face each other may be effectively increased. As a result, a channel width of a transistor including the conductive line 130 may be effectively extended, and thus reliability of a device may be improved.

While the conductive layer is etched back to form the conductive line 130, a part of the mask pattern M2 is consumed and thus the thickness of the mask pattern M2 may decrease.

Figure 10F:
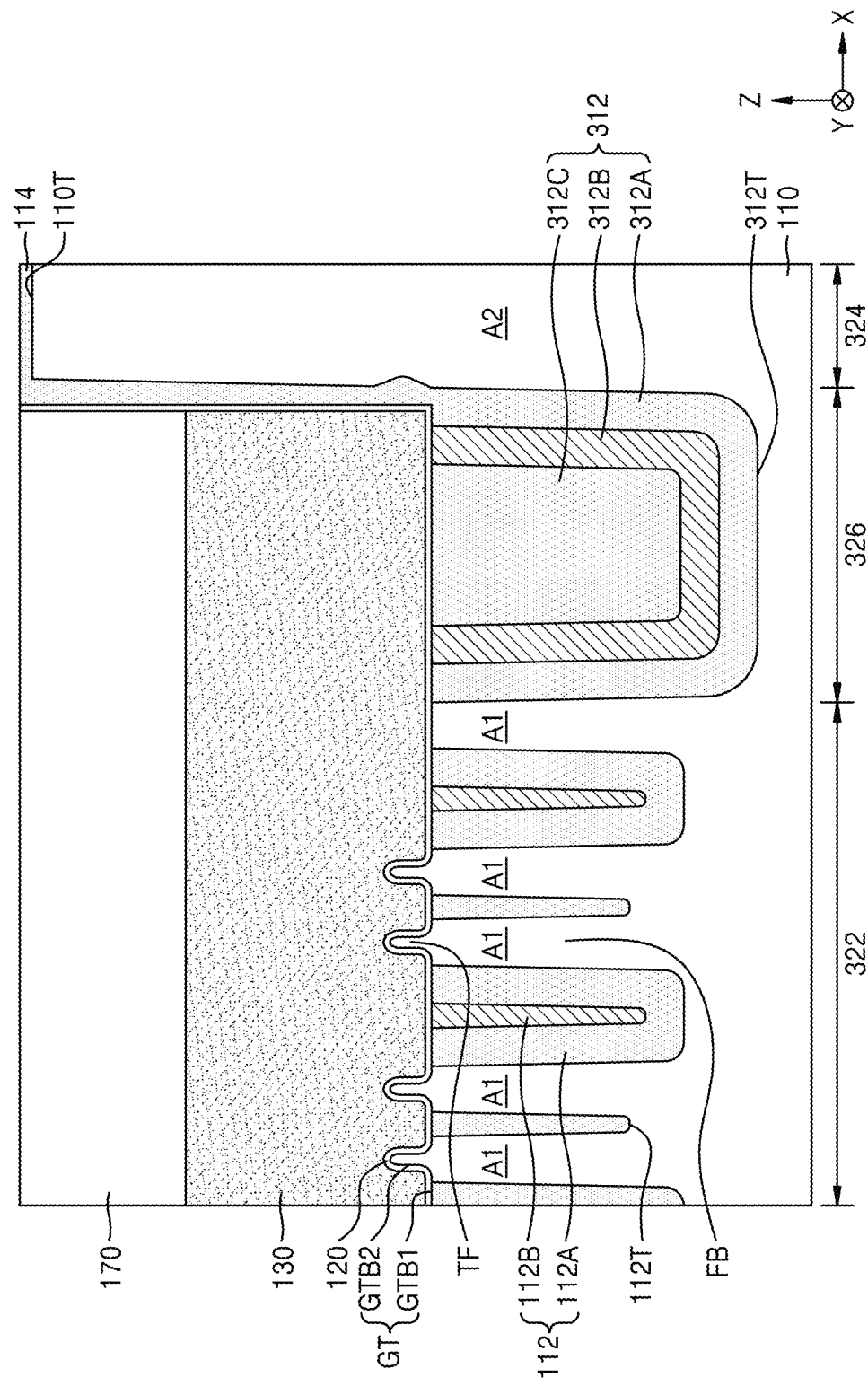

Referring to FIG. 10F, in the inner space of each of the gate trenches GT, a space remaining on the conductive line 130 is filled with the insulating capping pattern 170. Next, the mask pattern M2 remaining on the substrate 110 is removed, and the insulating thin film 114 covering the top surface 110T of the substrate 110 may be exposed.

In some embodiments, unlike the illustrated of FIG. 10F, while the insulating thin film 114 covering the top surface 110T of the substrate 110 remains, a planarization process is performed on the insulating capping pattern 170 and the insulating thin film 114 until the top surface 110T of the substrate 110 is exposed, thereby obtaining a resultant as illustrated in FIG. 8A.

According to the method of manufacturing the integrated circuit device 300 described with reference to FIGS. 10A to 10F, while the conductive layer is formed to form the conductive line 130, the conductive layer may fill well, without a deposition defect, the relatively narrow space between the two neighboring thinner fin portions TF in the inner space of each of the gate trenches GT, and thus the area where the thinner fin portion TF and the conductive line 130 face each other may be effectively increased. Accordingly, even when an area of the cell transistor area is reduced and a pitch of the active areas A1 decreases due to the downscaling of the integrated circuit device, the defective deposition problem due to the decreased interval between the active areas A1 may be address, and thus the channel width of the cell transistor may be effectively extended.

As described above, although the method of manufacturing the integrated circuit device 300 of FIGS. 8A and 8B is exemplarily described with reference to FIGS. 10A to 10F, by applying a variety of modifications and changes thereto within a range of the technical concept of the present inventive concept, it would have been obvious to one of ordinary skill in the art to manufacture the integrated circuit device 100 described with reference to FIGS. 5A to 5C, the integrated circuit device 200 described with reference to FIG. 7, the integrated circuit device 400 described with reference to FIG. 9, or various integrated circuit devices having a similar structure thereto, from the descriptions with reference to FIGS. 10A to 10F.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a substrate having a cell array area, a peripheral circuit area, and an interface area between the cell array area and the peripheral circuit area;
   a plurality of active areas in the substrate in the cell array area;
   a device isolation film covering a side wall of each of the plurality of active areas in the cell array area;
   an interface device isolation film filling an interface trench formed in the substrate in the interface area; and
   a plurality of conductive lines extending in the cell array area across the plurality of active areas in a first direction,
   wherein each of the plurality of active areas comprises a fin body portion located under the conductive lines and a thinner fin portion protruding from the fin body portion toward the conductive line and having a width less than a width of the fin body portion in the first direction, and
   wherein the interface device isolation film has a side wall on which a laterally protruding insulation portion is formed, the laterally protruding insulation portion extending long in a horizontal direction at a same level as a level of the thinner fin portion.

2. The integrated circuit device of claim 1, wherein the interface device isolation film comprises a gap-fill insulating film and an insulating liner surrounding the gap-fill insulating film, and the insulating liner comprises a protruding portion extending long in the horizontal direction at a same level as the level of the thinner fin portion and protruding toward the side wall of the interface device isolation film.

3. The integrated circuit device of claim 1, further comprising:
a gate dielectric film provided between the plurality of active areas and the conductive lines,
wherein the gate dielectric film comprises a first portion contacting the thinner fin portion, a second portion contacting an upper surface of the fin body portion, and a third portion contacting the device isolation film.

4. The integrated circuit device of claim 1, wherein the peripheral circuit area includes an active area having a side wall in which a lateral recess at the same level as a level of the thinner fin portion is formed.

5. The integrated circuit device of claim 1, wherein the peripheral circuit area includes an active area having a side wall in which a lateral recess at a same level as a level of the thinner fin portion is formed, and
the laterally protruding insulation portion protrudes toward the lateral recess.

6. An integrated circuit device comprising:
a substrate having a cell array area, a peripheral circuit area, and an interface area between the cell array area and the peripheral circuit area;
a plurality of active areas in the substrate in the cell array area;
a device isolation film covering a side wall of each of the plurality of active areas in the cell array area;
an interface device isolation film filling an interface trench formed in the substrate in the interface area;
a plurality of conductive lines extending in the cell array area across the plurality of active areas in a first direction; and
gate dielectric films provided between the plurality of active areas and the plurality of conductive lines,
wherein each of the plurality of active areas comprises a fin body portion located under the conductive lines and a thinner fin portion protruding from the fin body portion toward the conductive line and having a first width less than a second width of the fin body portion in the first direction,
wherein each of the gate dielectric films comprises a first portion contacting the thinner fin portion, a second portion contacting an upper surface of the fin body portion, and a third portion contacting the device isolation film, and
wherein each of the plurality of active areas further comprises an upper active area between two neighbouring conductive lines of the plurality of conductive lines, the upper active area having an uppermost surface at a level higher than a top surface of the plurality of conductive lines, and a middle active area connected between the fin body portion and the upper active area and having a third width less than the second width of the fin body portion and less than a fourth width of the upper active area in the first direction.

7. The integrated circuit device of claim 6, wherein each of the plurality of conductive lines comprises a first portion facing the thinner fin portion, a second portion facing the upper surface of the fin body portion, and a third portion facing the device isolation film.

8. The integrated circuit device of claim 6, wherein each of the plurality of active areas has a side wall in which a lateral recess is formed, the lateral recess extending long in a horizontal direction at a same level as a level of the thinner fin portion.

9. The integrated circuit device of claim 6, wherein the device isolation film has a side wall on which a laterally protruding insulation portion is located, the laterally protruding insulation portion extending long in a horizontal direction at a same level as a level of the thinner fin portion.

10. The integrated circuit device of claim 6, wherein each of the plurality of conductive lines comprises a recess bottom that surrounds the thinner fin portion.

11. An integrated circuit device comprising:
a substrate having a cell array area, a peripheral circuit area, and an interface area between the cell array area and the peripheral circuit area;
a plurality of active areas in the substrate in the cell array area;
a device isolation film covering a side wall of each of the plurality of active areas in the cell array area;
an interface device isolation film filling an interface trench formed in the substrate in the interface area; and
a plurality of conductive lines extending in the cell array area across the plurality of active areas in a first direction,
wherein each of the plurality of active areas comprises a fin body portion located under the conductive lines and a thinner fin portion protruding from the fin body portion toward the conductive line and having a first width less than a second width of the fin body portion in the first direction, and
wherein the peripheral circuit area includes an active area having a side wall in which a lateral recess at a same level as a level of the thinner fin portion is formed.

12. The integrated circuit device of claim 11, wherein each of the plurality of active areas further comprises an upper active area having an uppermost surface at a level higher than a top surface of the plurality of conductive lines, and a middle active area connected between the fin body portion and the upper active area and having a third width less than the second width of the fin body portion and less than a fourth width of the upper active area in the first direction.

13. The integrated circuit device of claim 11, further comprising:
a gate trench extending in the first direction across the plurality of active areas and the device isolation film, the plurality of conductive lines filling a part of the gate trench,
wherein the gate trench comprises a first bottom where the device isolation film is exposed and a second bottom where the thinner fin portion and the fin body portion are exposed, and the first bottom is at a level lower than the second bottom.

14. The integrated circuit device of claim 11, wherein each of the plurality of conductive lines comprises a recess bottom that surrounds the thinner fin portion.

15. The integrated circuit device of claim 11, wherein each of the plurality of active areas has a side wall including a lateral recess at a same level as the thinner fin portion, and
wherein the device isolation film has a side wall including a laterally protruding insulation portion that protrudes toward the lateral recess.

16. The integrated circuit device of claim 11, wherein each of the plurality of active areas has a side wall including a lateral recess extending long in a horizontal direction.

17. The integrated circuit device of claim 11, wherein each of the plurality of active areas further comprises an upper active area having an uppermost surface at a level higher than a top surface of the plurality of conductive lines, and a middle active area connected between the fin body portion and the upper active area, and wherein the middle active area and the thinner fin portion are at a same level in a horizontal direction.

18. The integrated circuit device of claim 11, wherein a side wall of the device isolation film includes a portion having a negative profile extending such that a width of the device isolation film in a horizontal direction decreases toward an uppermost surface of the plurality of active areas.

19. The integrated circuit device of claim 11, wherein each of the plurality of active areas has a side wall including a lateral recess extending long in a horizontal direction, and the device isolation film has a side wall including a laterally protruding insulation portion that protrudes toward the lateral recess, and wherein the device isolation film comprises a gap-fill insulating film and an insulating liner that surrounds the gap-fill insulating film, the insulating liner comprising a protruding portion that protrudes toward the laterally protruding insulation portion.

\* \* \* \* \*